US 9,190,463 B2

(12) United States Patent
Mohammed et al.

(10) Patent No.: US 9,190,463 B2
(45) Date of Patent: Nov. 17, 2015

(54) HIGH DENSITY THREE-DIMENSIONAL INTEGRATED CAPACITORS

(71) Applicant: Tessera, Inc., San Jose, CA (US)

(72) Inventors: Ilyas Mohammed, Santa Clara, CA (US); Belgacem Haba, Saratoga, CA (US); Cyprian Emeka Uzoh, San Jose, CA (US); Piyush Savalia, San Jose, CA (US); Vage Oganesian, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/291,672

(22) Filed: May 30, 2014

(65) Prior Publication Data
US 2014/0273393 A1 Sep. 18, 2014

Related U.S. Application Data

(60) Division of application No. 13/182,890, filed on Jul. 14, 2011, now Pat. No. 8,742,541, which is a continuation-in-part of application No. 12/964,049, filed on Dec. 9, 2010, now Pat. No. 8,502,340.

(51) Int. Cl.
*H01L 49/02* (2006.01)
*H01L 21/00* (2006.01)
(Continued)

(52) U.S. Cl.
CPC .................. *H01L 28/40* (2013.01); *H01G 4/06* (2013.01); *H01L 21/76898* (2013.01);
(Continued)

(58) Field of Classification Search
CPC ......... H01L 49/02; H01L 21/02; H01L 29/92; H01L 27/108; H01L 29/94; H01L 29/945; H01L 29/66181; H01L 21/00; H01L 21/76898; H01L 27/1087; H01L 27/1085; H01L 27/10829

USPC .......... 438/381, 190, 243, 244, 259, 386, 387
See application file for complete search history.

(56) References Cited

U.S. PATENT DOCUMENTS

| 5,759,903 A | 6/1998 | Lehmann et al. |
| 6,432,765 B1 | 8/2002 | Keller et al. |

(Continued)

FOREIGN PATENT DOCUMENTS

| JP | 2007516589 | 6/2007 |
| JP | 2009049212 | 3/2009 |

(Continued)

OTHER PUBLICATIONS

Japanese Office Action for Application No. 2013-543160 dated Mar. 20, 2015.

(Continued)

*Primary Examiner* — Chuong A Luu
(74) *Attorney, Agent, or Firm* — Lerner, David, Littenberg, Krumholz & Mentlik, LLP

(57) ABSTRACT

A capacitor can include a substrate having a first surface, a second surface remote from the first surface, and a through opening extending between the first and second surfaces, first and second metal elements, and a capacitor dielectric layer separating and insulating the first and second metal elements from one another at least within the through opening. The first metal element can be exposed at the first surface and can extend into the through opening. The second metal element can be exposed at the second surface and can extend into the through opening. The first and second metal elements can be electrically connectable to first and second electric potentials. The capacitor dielectric layer can have an undulating shape.

20 Claims, 13 Drawing Sheets

(51) Int. Cl.
*H01G 4/06* (2006.01)
*H01L 21/768* (2006.01)
*H01L 23/48* (2006.01)
*H01L 23/64* (2006.01)
*H01L 23/498* (2006.01)
H01L 25/16 (2006.01)
H01L 25/065 (2006.01)

(52) U.S. Cl.
CPC ....... *H01L 23/481* (2013.01); *H01L 23/49822* (2013.01); *H01L 23/49827* (2013.01); *H01L 23/642* (2013.01); *H01L 28/91* (2013.01); H01L 25/0657 (2013.01); H01L 25/16 (2013.01); H01L 2223/6622 (2013.01); H01L 2924/0002 (2013.01)

(56) References Cited

U.S. PATENT DOCUMENTS

| | | | |
|---|---|---|---|
| 6,559,004 | B1 | 5/2003 | Yang et al. |
| 6,565,730 | B2 | 5/2003 | Chakravorty et al. |
| 6,963,483 | B2 | 11/2005 | Chakravorty et al. |
| 7,608,904 | B2 | 10/2009 | Sinha |
| 7,626,257 | B2 * | 12/2009 | Knorr ............................ 257/698 |
| 7,629,249 | B2 * | 12/2009 | Borthakur ..................... 438/637 |
| 7,633,112 | B2 * | 12/2009 | Won et al. ...................... 257/308 |
| 7,645,669 | B2 * | 1/2010 | Hsu et al. ....................... 438/257 |
| 7,666,788 | B2 * | 2/2010 | Sinha ............................ 438/667 |
| 7,927,990 | B2 * | 4/2011 | Hsia et al. ..................... 438/584 |
| 8,085,522 | B2 * | 12/2011 | Sasaki et al. .................. 361/303 |
| 8,330,272 | B2 | 12/2012 | Haba |
| 8,598,695 | B2 | 12/2013 | Oganesian et al. |
| 8,697,569 | B2 | 4/2014 | Oganesian et al. |
| 2002/0185671 | A1 | 12/2002 | Kim |
| 2003/0036244 | A1 | 2/2003 | Jones et al. |
| 2004/0108587 | A1 | 6/2004 | Chudzik et al. |
| 2005/0133903 | A1 | 6/2005 | Palanduz |
| 2005/0266652 | A1 | 12/2005 | Chudzik et al. |
| 2006/0001174 | A1 | 1/2006 | Matsui |
| 2007/0032061 | A1 | 2/2007 | Farnworth et al. |
| 2007/0035030 | A1 | 2/2007 | Horton et al. |
| 2007/0131997 | A1 | 6/2007 | Ohtsuka et al. |
| 2007/0273005 | A1 | 11/2007 | Hwang |
| 2008/0246136 | A1 | 10/2008 | Haba et al. |
| 2009/0267183 | A1 | 10/2009 | Temple et al. |
| 2010/0052099 | A1 | 3/2010 | Chang et al. |
| 2012/0018863 | A1 | 1/2012 | Oganesian et al. |
| 2012/0018868 | A1 | 1/2012 | Oganesian et al. |
| 2012/0018893 | A1 | 1/2012 | Oganesian et al. |
| 2012/0018894 | A1 | 1/2012 | Oganesian et al. |
| 2012/0020026 | A1 | 1/2012 | Oganesian et al. |

FOREIGN PATENT DOCUMENTS

| | | |
|---|---|---|
| JP | 2009515356 | 4/2009 |
| JP | 05-198741 | 5/2013 |
| KR | 2003-0086594 | 10/2002 |
| KR | 2005-0019000 A | 2/2005 |
| KR | 2006-0105797 A | 10/2006 |
| KR | 2008-0043139 A | 5/2008 |
| WO | 02/078087 A2 | 10/2002 |
| WO | 2007054870 A1 | 5/2007 |

OTHER PUBLICATIONS

International Search Report and Written Opinion for Application No. PCT/US2011/064219 dated May 22, 2012.

International Search Report Application No. PCT/US2011/044026, dated Oct. 25, 2011.

International Search Report, PCT/US2011/044026, dated Jan. 17, 2012.

Office Action from Korean Application No. 10-2011-0104751 dated Nov. 11, 2011.

* cited by examiner

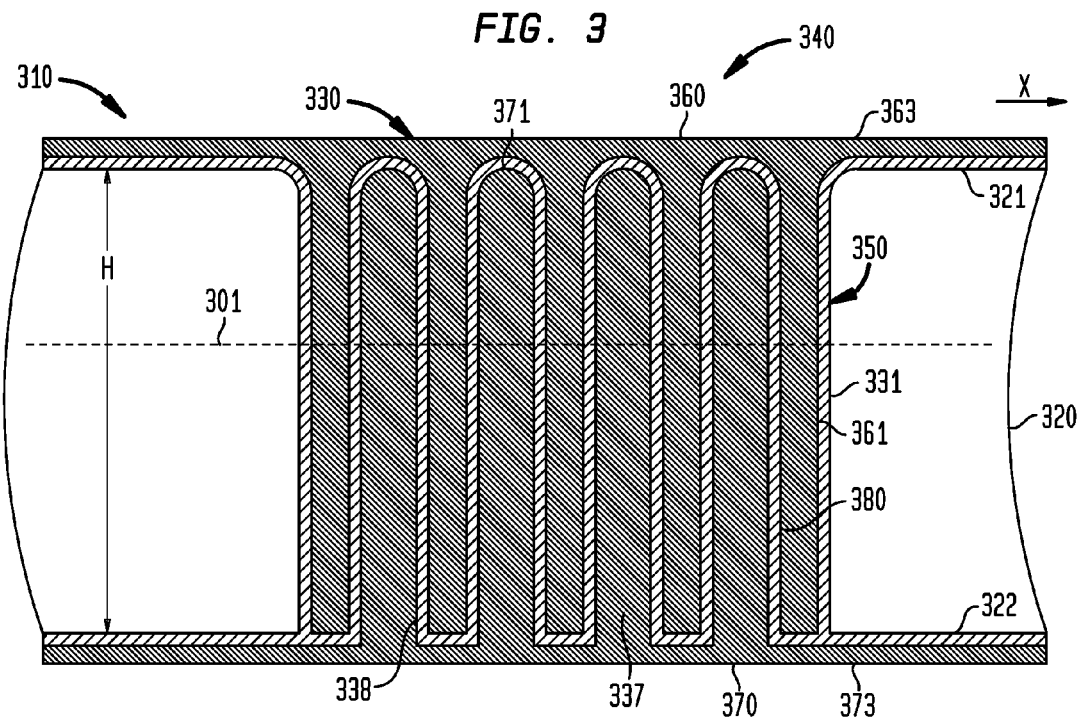
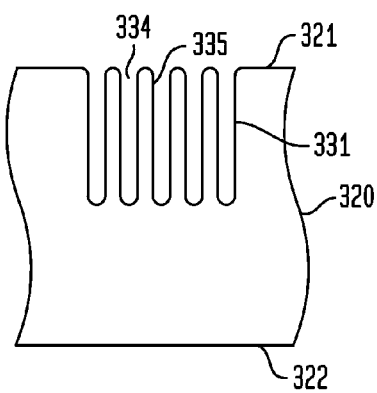
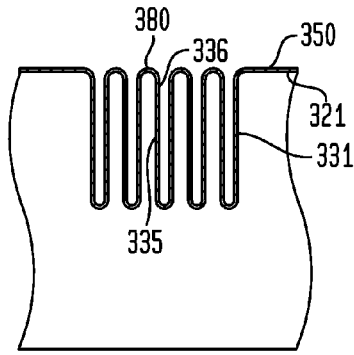
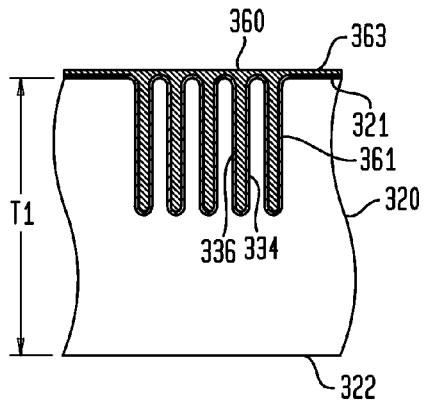
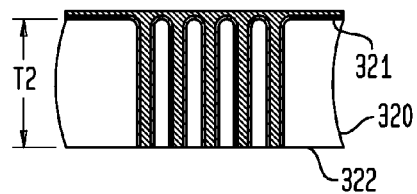

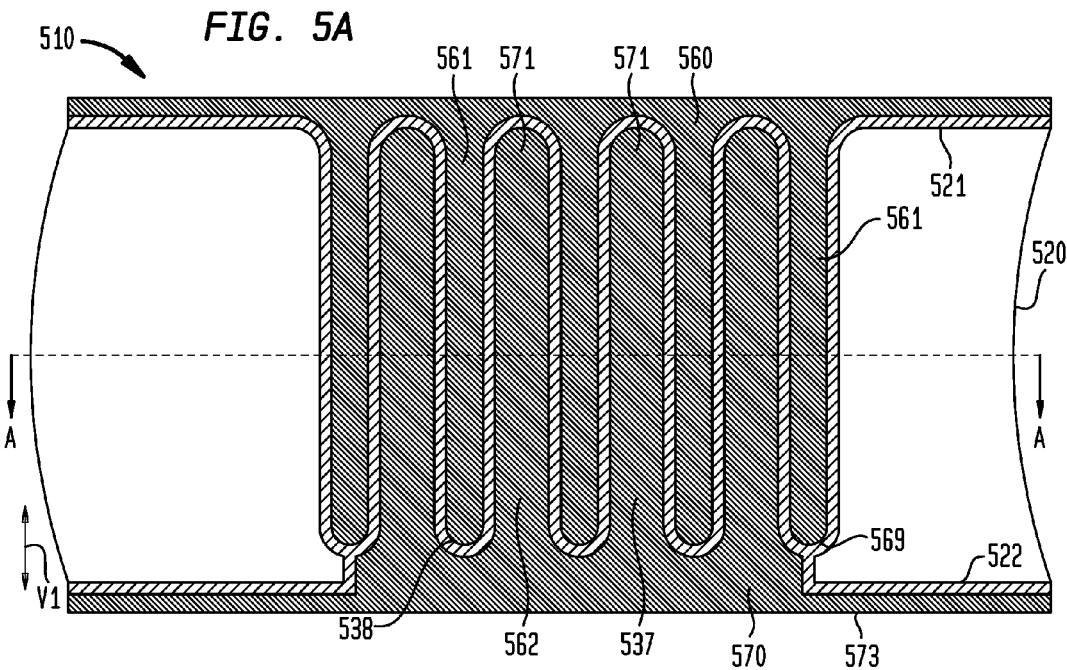
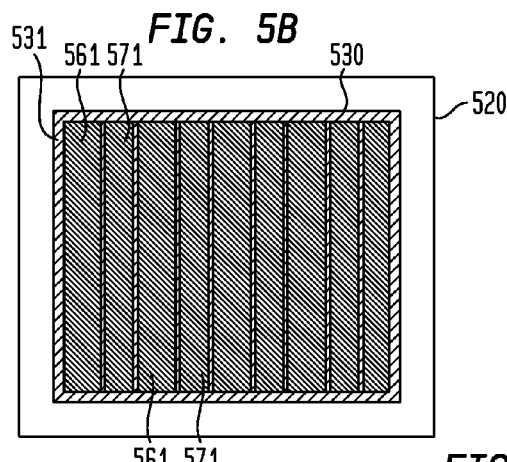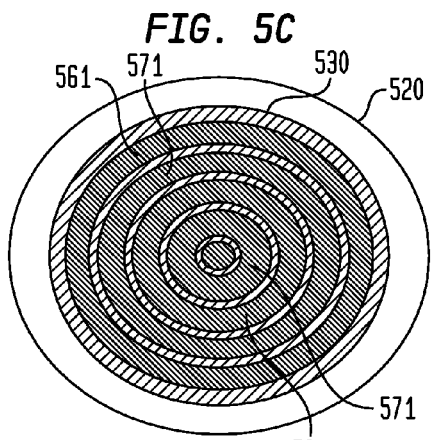
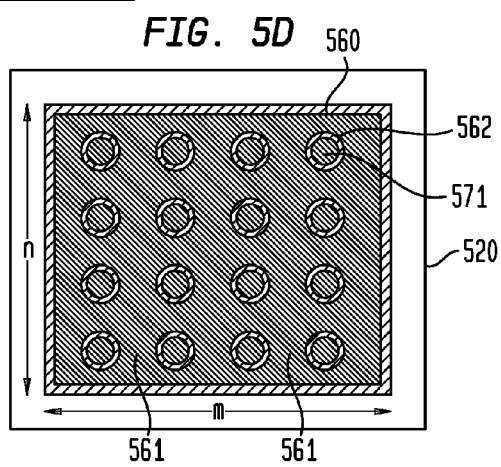

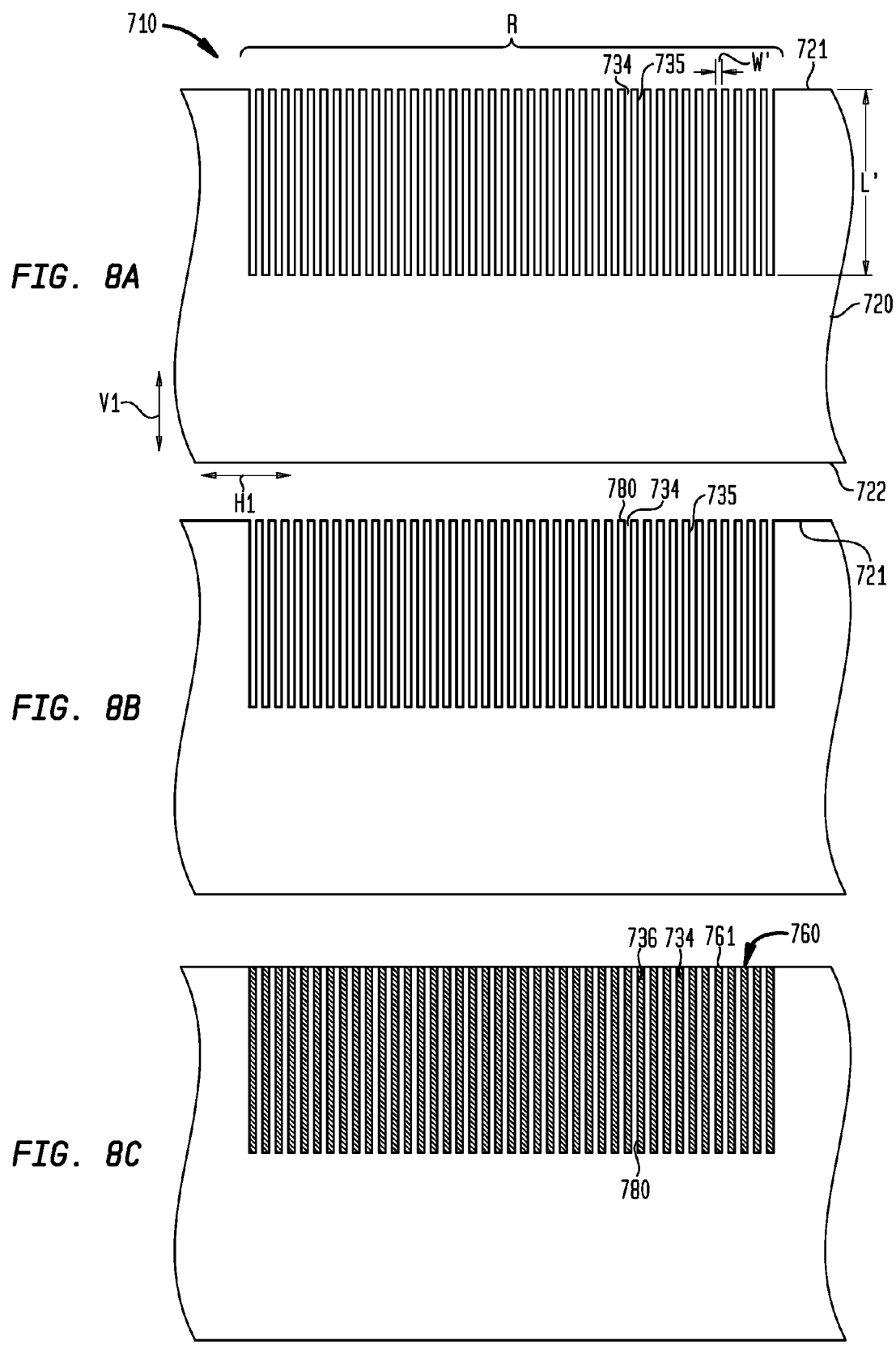

HIGH DENSITY THREE-DIMENSIONAL INTEGRATED CAPACITORS

CROSS-REFERENCE TO RELATED APPLICATIONS

The present application is a divisional of U.S. patent application Ser. No. 13/182,890, filed Jul. 14, 2011, which is a continuation-in-part of U.S. patent application Ser. No. 12/964,049 filed Dec. 9, 2010, the disclosures of which are hereby incorporated herein by reference.

BACKGROUND OF THE INVENTION

The present invention relates to capacitors in semiconductor chips or particular types of substrates, e.g., semiconductor, glass, ceramic, or other relatively low CTE materials and methods of making such capacitors, and to components useful in such capacitors.

Capacitors are commonly used for noise suppression, either in signal lines or in power lines. In power lines, noise suppression can be accomplished by mounting many capacitors along the power line to reduce the impedance level. Such capacitor mounting can increase the size and cost of the system, because the cost of mounting the capacitors can be higher than the cost of the capacitors.

Capacitors can be provided on semiconductor chips having active circuit elements, i.e., "active chips" or can be provided on passive chips containing passive circuit elements such as capacitors, inductors, resistors, etc., for mounting to active chips.

Conventional capacitors in silicon can be of two general types. A first type is used to store charge for each bit in a DRAM chip. A second type is capacitors on passive chips, where the primary focus has been on planar capacitors with very thin dielectric materials having a very high dielectric constant, in a single or multi-layer format. Both types of conventional capacitors can have limitations when applied to decoupling capacitor applications. The first type of capacitor may not be well suited for high capacitance applications, because that type is typically meant for usage at bit level and therefore is purposely designed to have a very small size. The first type typically lacks features needed to store or supply sufficient current as a decoupling capacitor. The second type of capacitor may have a low capacitance density and a low quality factor (efficiency).

Further improvements would be desirable in the design of capacitors in microelectronic chips, semiconductor substrates, or other substrates having relatively low CTE such as glass or ceramic material.

BRIEF SUMMARY OF THE INVENTION

In accordance with an aspect of the invention, a capacitor can include a substrate having a first surface, a second surface remote from the first surface, and a through opening extending between the first and second surfaces, first and second metal elements, and a capacitor dielectric layer separating and insulating the first and second metal elements from one another at least within the through opening. The first metal element can be exposed at the first surface and can extend into the through opening. The second metal element can be exposed at the second surface and can extend into the through opening. The first and second metal elements can be electrically connectable to first and second electric potentials. The capacitor dielectric layer can have an undulating shape.

In a particular embodiment, the first and second metal elements can include a respective plurality of first and second plates, each of the first and second plates extending into the opening. In one embodiment, each of the first and second plates can have a width in a direction along the first surface of at least 5 microns. In an exemplary embodiment, the first and second pairs of plates of each capacitor may not extend above the first surface or below the second surface.

In accordance with another aspect of the invention, a capacitor can include a substrate having a first surface, a second surface remote from the first surface, and a through opening extending between the first and second surfaces, first and second metal elements, and a capacitor dielectric layer separating and insulating the first metal elements from the second metal element at least within the through opening. The first metal element can be exposed at the first surface and can extend into the through opening. The first metal element can include a plurality of posts arranged to fill a first plurality of positions within an m×n array being at least some of the positions of the array, each of m and n being greater than 1. Each post can extend into the through opening in a vertical direction substantially perpendicular to the first surface. Each post can include a substantially vertical portion that is substantially parallel to a corresponding substantially vertical portion of at least one adjacent post. The second metal element can be exposed at the second surface and can extend into the through opening. The second metal element can extend between adjacent ones of the plurality of posts. The first and second metal elements can be electrically connectable to first and second electric potentials.

In one embodiment, a second plurality of positions within the m×n array can be occupied by an insulating dielectric material. In a particular embodiment, wherein each of a second plurality of positions within the m×n array can include a continuous void extending at least 50% of a height of the through opening. In an exemplary embodiment, each of a second plurality of positions within the m×n array can include voids accounting for at least 50% of an internal volume of a second opening corresponding to the respective position within the through opening. In a particular embodiment, the first plurality of positions within the m×n array can be all of the positions within the array.

In an exemplary embodiment, the capacitor can also include an insulating dielectric material extending along a boundary surface of the through opening between the first and second surfaces. The insulating dielectric material can separate and insulate the first and second metal elements from the material of the substrate at least within the through opening. In a particular embodiment, each of the plurality of posts can have a width in a horizontal plane substantially perpendicular to the vertical direction of 5 microns or less. In one embodiment, each of the plurality of posts can have a length in the vertical direction, and the ratio of the length to the width of each of the posts can be at least 10. In an exemplary embodiment, the length of each of the plurality of posts can be at least 150 microns. In a particular embodiment, the plurality of posts can define a pitch in the horizontal plane of 10 microns or less. In one embodiment, the capacitor dielectric layer can extend along the surfaces of the plurality of posts. In an exemplary embodiment, the plurality of posts may not extend above the first surface or below the second surface.

In a particular embodiment, the substrate can consist essentially of one material selected from the group consisting of: semiconductor, glass, and ceramic. In one embodiment, each of the first and second metal elements can include a metal layer that has a first surface adjacent the capacitor dielectric layer and a second surface opposite from the first surface, the second surface conforming to a contour of a surface of the capacitor dielectric layer. In a particular embodiment, at least one of the first and second metal elements can include a metal layer that has a first surface adjacent the capacitor dielectric layer and a second surface opposite from the first surface, the second surface conforming to a contour of a surface of the capacitor dielectric layer. In a particular embodiment, a portion of the opening that is not occupied by the first and second metal elements and the capacitor dielectric layer can be filled with a dielectric material. In one embodiment, each of the first and second metal elements can have a first portion that is separated from an adjacent second portion that is substantially parallel to the first portion by the dielectric material.

In an exemplary embodiment, the capacitor can also include first and second electrodes connected to the respective first and second metal elements. In one embodiment, the capacitor can have a capacitance of at least 1 picoFarad. In a particular embodiment, the capacitor dielectric layer can have a dielectric constant k greater than or equal to 3. In an exemplary embodiment, the capacitor dielectric layer can have a dielectric constant k greater than or equal to 5. In one embodiment, the capacitor dielectric layer can include a ferroelectric dielectric material. In a particular embodiment, upper and lower surfaces of the capacitor dielectric layer can each have a length at least triple the height of the opening between the first and second surfaces. In an exemplary embodiment, the first metal element can consist essentially of a first metal and the second metal element can consist essentially of a second metal different from the first metal.

In one embodiment, the opening can have a length dimension extending substantially parallel to the first surface and a width dimension extending substantially parallel to the first surface and substantially perpendicular to the length dimension, the length dimension being greater than the width dimension. In a particular embodiment, the opening can have a length dimension extending substantially parallel to the first surface and a width dimension extending substantially parallel to the first surface and substantially perpendicular to the length dimension, the length dimension being substantially equal to the width dimension. In an exemplary embodiment, a capacitor assembly including at least first and second capacitors can have first and second metal elements of each capacitor extending into a common through opening of the substrate. The capacitor assembly can also include an insulating dielectric layer separating and insulating the first and second capacitors from one another at least within the through opening. In one embodiment, the insulating dielectric layer can have a dielectric constant of less than 3, and each capacitor dielectric layer can have a dielectric constant greater than or equal to 3.

In a particular embodiment, an interposer can include a capacitor as described above. Further aspects of the invention provide systems which incorporate capacitor structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

In accordance with yet another aspect of the invention, a method of fabricating a component having electrodes for electrical interconnection with a circuit component or microelectronic element can include removing material from a first surface of a substrate consisting essentially of a material having an effective CTE of less than 10 ppm/° C. to form a plurality of first openings extending from the first surface towards a second surface opposite the first surface, the first openings defining an undulating inner surface. The method can also include forming a capacitor dielectric layer overlying the inner surface, the capacitor dielectric layer having an undulating first surface facing away from the inner surface, and forming a first metal element overlying the first surface of the capacitor dielectric layer and extending into each of the first openings. The method can further include removing material of the substrate between adjacent ones of the plurality of first openings so as to expose an undulating second surface of the capacitor dielectric layer to form a plurality of second openings extending from the second surface towards the first surface, and forming a second metal element overlying the second surface of the capacitor dielectric layer and extending into each of the second openings.

In an exemplary embodiment, the step of forming the capacitor dielectric layer can be performed by aqueous plating of a flowable dielectric material onto the inner surface exposed within each first opening. In a particular embodiment, the method can also include, before the step of removing material of the substrate between adjacent ones of the plurality of first openings, removing material from the second surface of the substrate, such that a thickness of the substrate between the first and second surfaces is reduced. In one embodiment, the step of removing material of the substrate between adjacent ones of the plurality of first openings can be performed such that a surface of the first metal element is exposed at the second surface. In an exemplary embodiment, the step of forming the first metal element can include forming a plurality of first plates, each of the first plates extending into a respective one of the first openings, and the step of forming the second metal element can include forming a plurality of second plates, each of the second plates extending into a respective one of the second openings.

In accordance with still another aspect of the invention, a method of fabricating a component having electrodes for electrical interconnection with a circuit component or microelectronic element can include forming a plurality of first openings extending from a first surface of a substrate towards a second surface opposite the first surface, the first openings arranged to occupy at least some positions in an m×n array of positions, each of m and n being greater than 1, each first opening extending into the through opening in a vertical direction substantially perpendicular to the first surface, the plurality of first openings defining an inner surface. The method can also include forming a first capacitor dielectric layer overlying a first portion of the inner surface, the first capacitor dielectric layer having a first surface facing away from the inner surface, and forming a first metal element having a plurality of posts, each post overlying the first surface of the first capacitor dielectric layer and extending into a corresponding opening of the first openings. The method can further include removing material of the substrate between adjacent ones of the first subset of the plurality of posts so as to expose a second surface of the first capacitor dielectric layer to form a second opening extending from the second surface towards the first surface, and forming a second metal element overlying the second surface of the first capacitor dielectric layer and extending into the second opening.

In one embodiment, the substrate can have an effective CTE of less than 10 ppm/° C. In a particular embodiment, a first plurality of the posts can extend into a first subset of the first openings located at a first plurality of positions within the m×n array. The method can also include depositing an insulating dielectric material into a second subset of the first openings located at a second plurality of positions within the m×n array. In one embodiment, the plurality of posts can extend into all of the first openings. In an exemplary embodiment, the first openings can be formed by removing material from the first surface to form a plurality of pores. In one embodiment, the substrate can include a silicon material, and the step of forming the plurality of first openings can be performed by anisotropic etching, such that a region of porous silicon is produced extending from the first surface of the substrate. In a particular embodiment, the step of forming the plurality of first openings can be performed such that the inner surface has an undulating shape.

In an exemplary embodiment, each first opening can have a width in a horizontal plane substantially perpendicular to the vertical direction of 5 microns or less. In a particular embodiment, the step of forming the plurality of first openings can be performed such that each first opening has a length in the vertical direction, the ratio of the length to the width of each first opening being at least 10. In one embodiment, the step of forming the plurality of first openings can be performed such that the length of each first opening is at least 150 microns. In an exemplary embodiment, the step of forming the plurality of first openings can be performed such that the first openings define a pitch in the horizontal plane of 10 microns or less. In a particular embodiment, the step of forming the first capacitor dielectric layer can be performed such that the first surface of the first capacitor dielectric layer has an undulating shape. In one embodiment, the second surface of the first capacitor dielectric layer can have an undulating shape.

In a particular embodiment, the step of forming the first capacitor dielectric layer can be performed such that upper and lower surfaces of the capacitor dielectric layer each have a length at least triple the length of each first opening. In an exemplary embodiment, the step of forming the first capacitor dielectric layer can be performed by aqueous plating of a flowable dielectric material onto the first portion of the inner surface. In one embodiment, the method can also include, before the step of removing material of the substrate between adjacent ones of the first subset of the first openings, removing material from the second surface of the substrate, such that a thickness of the substrate between the first and second surfaces is reduced. In a particular embodiment, the step of removing material of the substrate between adjacent ones of the first subset of the first openings can be performed such that a surface of each of the posts is exposed at the second surface. In an exemplary embodiment, the step of forming the first metal element can be performed such that each post includes a substantially vertical portion that is substantially parallel to a corresponding substantially vertical portion of at least one adjacent post.

In one embodiment, at least one of the first and second metal elements can be a metal layer that conforms to a contour of a surface of the capacitor dielectric layer. In a particular embodiment, each of the first and second metal elements can have a first portion that is separated from an adjacent second portion that is substantially parallel to the first portion by a dielectric material. In an exemplary embodiment, the method can also include forming a first electrode connected to the first metal element and a second electrode connected to the second metal element. The first and second electrodes can be exposed at the respective first and second surfaces. The first and second electrodes can be connectable to respective first and second electric potentials.

In an exemplary embodiment, the method can also include forming a second capacitor dielectric layer overlying a second portion of the inner surface, the second capacitor dielectric layer having a first surface facing away from the inner surface, and forming an insulating dielectric layer overlying a third portion of the inner surface between the first and second portions of the inner surface, the insulating dielectric layer extending into a second subset of the first openings. The method can further include forming a third metal element having a plurality of posts, each post overlying the first surface of the second capacitor dielectric layer and extending into a corresponding opening of a third subset of the first openings, and removing material of the substrate between adjacent ones of the third subset of the first openings so as to expose a second surface of the second capacitor dielectric layer to form a third opening extending from the second surface towards the first surface. The method can also include forming a fourth metal element overlying the second surface of the second capacitor dielectric layer and extending into the third opening.

In a particular embodiment, the insulating dielectric layer can have a dielectric constant of less than 3, and each capacitor dielectric layer can have a dielectric constant greater than or equal to 3. In an exemplary embodiment, the method can also include forming first, second, third, and fourth electrodes respectively connected to the first, second, third, and fourth metal elements, the first and third electrodes being exposed at the first surface, the second and fourth electrodes being exposed at the second surface, the first, second, third, and fourth electrodes being connectable to respective first, second, third, and fourth electric potentials. In one embodiment, the first and second metal elements and the first capacitor dielectric layer can define a first capacitor, and the third and fourth metal elements and the second capacitor dielectric layer can define a second capacitor. In a particular embodiment, the insulating dielectric layer can separate and insulate at least a portion of the first and second capacitors from one another.

BRIEF DESCRIPTION OF THE DRAWINGS

FIG. 3 is a sectional view illustrating a capacitor in accordance with another embodiment.

FIGS. 4A-4G are sectional views illustrating stages of fabrication in accordance with the embodiment of the invention depicted in FIG. 3.

FIG. 5A is a sectional view illustrating a capacitor in accordance with yet another embodiment.

FIGS. 5B-5D illustrates alternative top-down sectional views that can correspond to the capacitors shown in FIG. 3 or 5A, taken along the line A-A of FIG. 5A.

FIGS. 8A-8F are sectional views illustrating stages of fabrication in accordance with the embodiment of the invention depicted in FIG. 5A.

DETAILED DESCRIPTION

A capacitor can be composed of conductors, and the wider the conductors are with respect to the current flow, the lower the inductance can be. Another way to achieve a lower inductance can be to have a ground layer of the capacitor be relatively close to the input/output layer. In a two-terminal capacitor as in one or more embodiments herein, a ground plane in the capacitor can be connected to an external ground layer by traces and/or vias. Another type of capacitor formed according to one or more embodiments herein is a three-terminal capacitor having an internal ground layer. Three-terminal capacitors can have greatly reduced inductance relative to a two-terminal capacitor and therefore can have substantially improved noise-removing performance.

Figure 1A:
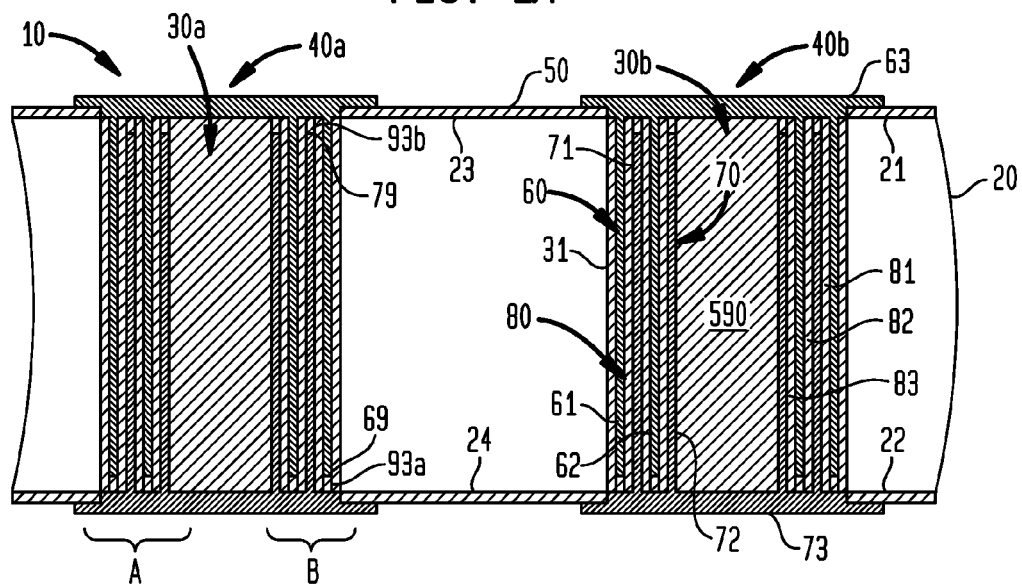
FIG. 1A is a sectional view illustrating a capacitor in accordance with an embodiment of the invention.
Figure 1B:
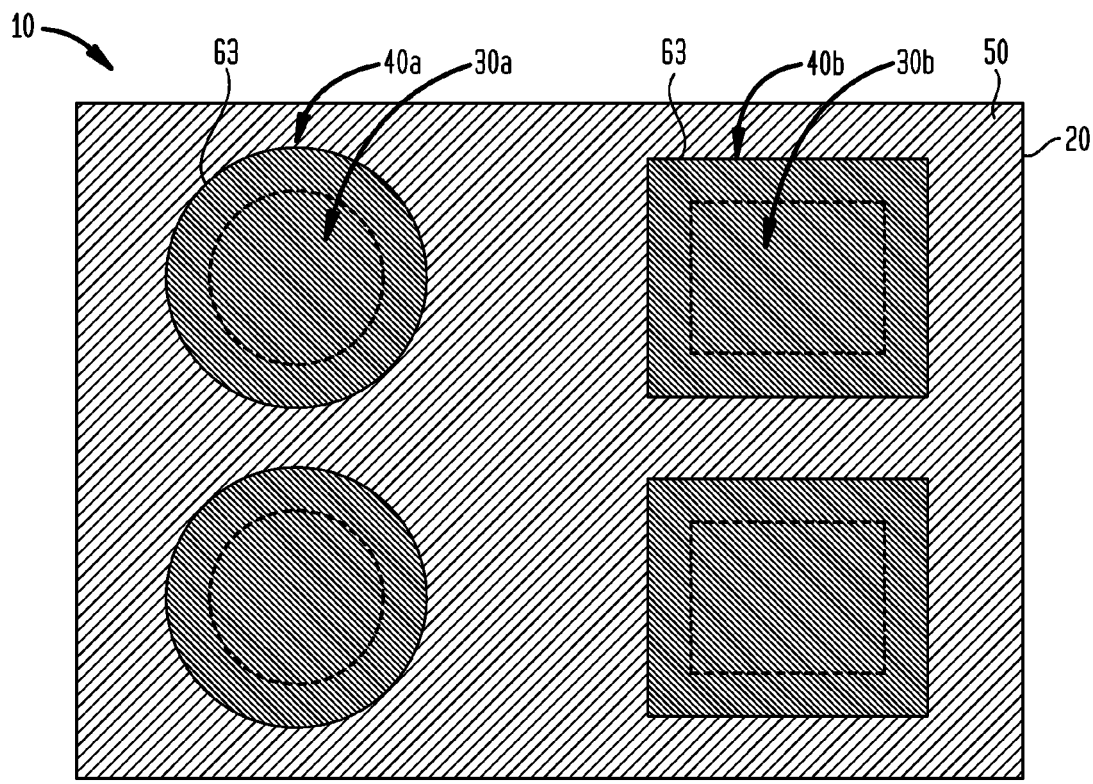
FIG. 1B illustrates alternative top-down plan views that can correspond to the capacitors shown in FIG. 1A or any of the other capacitors described herein.

With reference to FIGS. 1A and 1B, a component 10 according to an embodiment of the present invention includes a substrate 20 and capacitors 40a and 40b (collectively capacitors 40) formed in contact with the substrate. The substrate 20 has through openings 30a and 30b (collectively through openings 30) extending through the substrate between a planar first surface 21 and a planar second surface 22 opposite the first surface. Each capacitor 40 includes an insulating dielectric layer 50 overlying an inner surface 31 of the corresponding opening 30 and portions of the first and second surfaces 21 and 22, a first pair of electrically conductive plates 60, a second pair of electrically conductive plates 70, and a plurality of capacitor dielectric layers 80 separating each of the plates 60 and 70 from at least one adjacent plate. A dielectric region 90 occupies the remaining volume within each corresponding opening 30 that is not occupied by the plates 60 and 70 and the dielectric layers 550 and 80.

In some embodiments, the component 10 may be a semiconductor chip, a wafer, a dielectric substrate, or the like. The substrate 20 preferably has a coefficient of thermal expansion ("CTE") less than $10 \times 10^{-6}/^\circ$ C. (or ppm/$^\circ$ C.). In a particular embodiment, the substrate 20 can have a CTE less than $7 \times 10^{-6}/^\circ$ C. The substrate 20 may consist essentially of an inorganic material such as semiconductor, glass, or ceramic. In embodiments wherein the substrate 20 is made of a semiconductor, such as silicon, a plurality of active semiconductor devices (e.g., transistors, diodes, etc.) can be disposed in an active semiconductor region thereof located at and/or below the first surface 21 or the second surface 22.

In one example, the substrate 20 can be an interposer to which one or more semiconductor chips can be mounted and electrically connected therewith, the interposer having electrically conductive contacts usable for interconnection with another component such as a circuit panel, e.g., circuit board, module, passive component, etc. The semiconductor chip(s) mounted to the interposer may have active semiconductor devices therein.

The thickness of the substrate 20 between the first surface 21 and the second surface 22 typically is less than 200 μm, and can be significantly smaller, for example, 130 μm, 70 μm or even smaller. While not specifically shown in the figures, active semiconductor devices in the substrate 20 can be conductively connected to the capacitors 40. Each capacitor 40 can be formed at least partially within one or more openings 30.

In FIG. 1A, the directions parallel to the first surface 21 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The substrate 20 can further include a dielectric layer (not shown) overlying the first surface 21 and/or the second surface 22. Such a dielectric layer can electrically insulate conductive elements from the substrate 20. This dielectric layer can be referred to as a "passivation layer" of the substrate 20. The passivation layer can include an inorganic or organic dielectric material or both. The dielectric layer may include an electrodeposited conformal coating or other dielectric material, for example, a photoimageable polymeric material, for example, a solder mask material.

The through opening 30 can have any top-view shape, including for example, circular (shown as opening 30a in FIG. 1B), oval, square, rectangular (as shown as opening 30b in FIG. 1B), or other shapes. In some examples, the through opening 30 can have any three-dimensional shape, including for example, a cylinder, a cube, a prism, or a frustoconical shape, among others.

The inner surface 31 of each respective through opening 30 can extend from the first surface 21 through the substrate 20 at any angle. Preferably, the inner surface 31 extends from the first surface 21 at approximately 90 degrees to the horizontal plane defined by the first surface. The through opening 30 has substantially right-angled edges 33 where the inner surface 31 meets the first and second surfaces 21 and 22, although in other embodiments, the edges 33 can alternatively be chamfered or rounded. The inner surface 31 can have a constant slope or a varying slope. For example, the angle or slope of the inner surface 31 relative to the horizontal plane defined by the first surface 21 can decrease in magnitude (i.e., become less positive or less negative) as the inner surface 31 penetrates further towards the second surface 22.

Each insulating dielectric layer 50 can overlie the inner surface 31 of the respective through opening 30 and portions of the first and second surfaces 21 and 22, to provide good dielectric isolation with respect to the substrate 20 and the conductive plates 60 and 70. The insulating dielectric layer 50 can include an inorganic or organic dielectric material or both. In a particular embodiment, the insulating dielectric layer 50 can include a compliant dielectric material. In a particular example, the insulating dielectric layer 50 (and all of the other insulating dielectric layers or materials described herein) can have a dielectric constant K of less than 3. In exemplary embodiments, the insulating dielectric layer 50 (and all of the other dielectric layers or dielectric materials described herein) can include a ferroelectric dielectric material such as barium strontium titanate (BST), hafnium dioxide, or lanthanum aluminate, among others, or a composite dielectric material made with nanoparticles such as a polymer matrix having ferroelectric nanoparticles therein.

The first pair of electrically conductive plates 60 includes a first plate 61 overlying the insulating dielectric layer 50 within the respective opening 30 and a second plate 62 overlying the first plate. At the first surface 21 of the substrate 20, the first pair of plates 60 can be connected to a single first electrode 63 exposed at the first surface, the first electrode being connectable with a first electric potential. The first electrode 63 can optionally be a plurality of electrodes exposed at the first surface, such that a portion of the first electrode extending between the inner surfaces 31 can be covered by an overlying insulating dielectric layer except where exposed for interconnection with another element external to the capacitor 40.

The second pair of electrically conductive plates 70 includes a third plate 71 overlying the first plate 61 and a fourth plate 72 overlying the second plate 62. At the second surface 22 of the substrate 20, the second pair of plates 70 can be connected to a single second electrode 73 exposed at the second surface, second electrode being connectable with a second electric potential. The second electrode 73 can optionally be a plurality of electrodes exposed at the second surface, such that a portion of the second electrode extending between the inner surfaces 31 can be covered by an overlying insulating dielectric layer except where exposed for interconnection with another element external to the capacitor 40.

As used in this disclosure, a statement that an electrically conductive element is "exposed at" a surface of a substrate or a dielectric element overlying a surface of the substrate indicates that the electrically conductive element is available for contact with a theoretical point moving in a direction perpendicular to the surface of the dielectric element toward the surface of the dielectric element from outside the dielectric element. Thus, an electrode or other conductive element which is exposed at a surface of a substrate may project from such surface; may be flush with such surface; or may be recessed relative to such surface and exposed through a hole or depression in the substrate.

The conductive plates 60 and 70 and the electrodes 63 and 73 (and any of the other conductive elements described herein) can be made from any electrically conductive metal, including for example, copper, tungsten, aluminum, nickel, a nickel alloy, or gold. While essentially any technique usable for forming conductive elements can be used to form the conductive elements described herein, particular techniques as discussed in greater detail in the commonly owned U.S. patent application Ser. No. 12/842,669, filed Jul. 23, 2010, can be employed, which is hereby incorporated by reference herein. Such techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

Each of the electrodes 63 and 73 (and any of the other electrodes described herein) can have any top-view shape, including, for example, a circular pad shape or a rectangular shape, both of which are shown in FIG. 1B, an oval shape, a square shape, a triangular shape, or a more complex shape. Each of the electrodes 63 and 73 can have any three-dimensional shape, including, for example, a frustoconical-shaped conductive post. Examples of conductive posts can be used, as shown and described in the commonly-owned U.S. patent application Ser. No. 12/832,376, filed on Jul. 8, 2010. In a particular embodiment, one ore more of the first and second electrodes 63 and 73 can be electrically connected to the respective first and second conductive plates 60 and 70 by conductive traces extending therebetween.

Connection between each of the electrodes 63 and 73 (or any of the other electrodes described herein) and components external to the component 10 can be through conductive masses (not shown). Such conductive masses can comprise a fusible metal having a relatively low melting temperature, e.g., solder, tin, or a eutectic mixture including a plurality of metals. Alternatively, such conductive masses can include a wettable metal, e.g., copper or other noble metal or non-noble metal having a melting temperature higher than that of solder or another fusible metal. Such wettable metal can be joined with a corresponding feature, e.g., a fusible metal feature of an interconnect element. In a particular embodiment, such conductive masses can include a conductive material interspersed in a medium, e.g., a conductive paste, e.g., metal-filled paste, solder-filled paste or isotropic conductive adhesive or anisotropic conductive adhesive.

The plurality of capacitor dielectric layers 80 can separate each of the plates 60 and 70 from at least one adjacent plate. Each capacitor dielectric layer 80 (and all of the other capacitor dielectric layers described herein) can have a dielectric constant k of at least 3. A first capacitor dielectric layer 81 of the capacitor dielectric layers 80 overlies the first plate 61 and extends between the first plate and the third plate 71. A second capacitor dielectric layer 82 of the capacitor dielectric layers 80 overlies the third plate 71 and extends between the third plate and the second plate 62. A third capacitor dielectric layer 83 of the capacitor dielectric layers 80 overlies the second plate 62 and extends between the second plate and the fourth plate 72.

Each dielectric region 90 can occupy the remaining volume within the corresponding opening 30 that is not occupied by the plates 60 and 70 and the dielectric layers 50 and 80. Each dielectric region 90 can provide good dielectric isolation between the fourth plate 72 and the first electrode 63. The dielectric region 90 can be compliant, having a sufficiently low modulus of elasticity and sufficient thickness such that the product of the modulus and the thickness provide compliancy.

The component 10 can further include a plurality of dielectric portions 93*a* and 93*b* (collectively dielectric portions 93), each dielectric portion 93*a* extending between a respective distal edge 69 of a corresponding first plate 60 and the second electrode 73, and each dielectric portion 93*b* extending between a respective distal edge 79 of a corresponding second plate 70 and the first electrode 63.

In one embodiment, the first and second pairs of plates 60 and 70 of each capacitor 40 can extend around the inner surface 31 of the corresponding through opening. For example, the first and second pairs of plates 60 and 70 can have an annular shape extending around a corresponding opening 30 having a circular or oval cross-sectional shape. An example top view of a capacitor 40a having a circular cross-sectional shape is shown in FIG. 1B. In another example, the first and second pairs of plates 60 and 70 can have flat planar portions extending around a corresponding opening 30 having a square or rectangular cross-sectional shape. An example top view of a capacitor 40b having a rectangular cross-sectional shape is shown in FIG. 1B.

In a particular embodiment, the component 10 can include two sets of first and second pairs of plates 60 and 70 extending through a single through opening 30a, each set of first and second pairs of plates comprising a respective region A or B of the component with the insulating dielectric region 90 extending therebetween.

In an example embodiment, the component 10 can include first and second independent capacitors 40a extending through a single through opening 30a, each capacitor comprising a respective region A or B of the component with the insulating dielectric region 90 extending therebetween. In such a component having two independent capacitors 40a extending through a single through opening 30a, the plates 60 and 70 of the first capacitor can be separated from the plates 60 and 70 of the second capacitor by an insulated gap extending between the two capacitors. Also in such an embodiment, the first and second electrodes 63 and 73 extending across the insulating dielectric region 90 between regions A and B can be split into separate first and second electrodes 63 and 73 for each capacitor by an insulated gap extending therebetween (not shown).

Figure 2A:
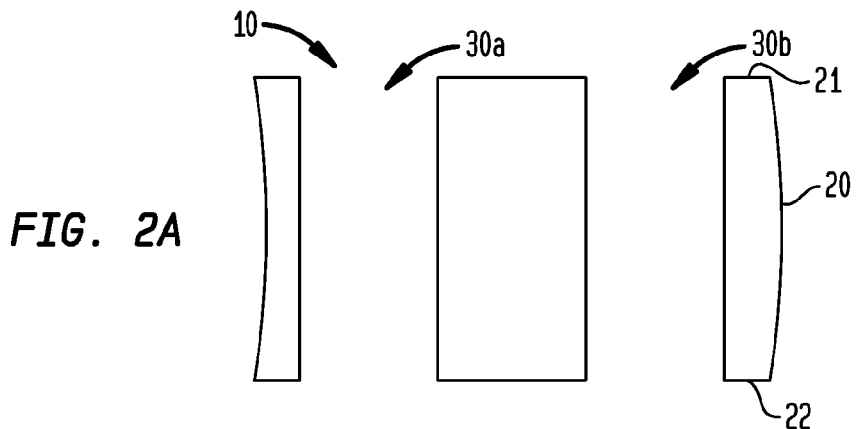
FIGS. 2A-2J are sectional views illustrating stages of fabrication in accordance with the embodiment of the invention depicted in FIG. 1A.

A method of fabricating the component 10 (FIGS. 1A and 1B) will now be described, with reference to FIGS. 2A-2J. As illustrated in FIG. 2A, the through openings 30a and 30b can be formed extending through the thickness of the substrate 20 from the first surface 21 towards the second surface 22 of from the second surface towards the first surface. The openings 30 can be formed for example, by selectively etching the substrate 20, after forming a mask layer where it is desired to preserve remaining portions of the first surface 21. For example, a photoimageable layer, e.g., a photoresist layer, can be deposited and patterned to cover only portions of the first surface 21, after which a timed etch process can be conducted to form the openings 30.

The inner surfaces 31 of the openings 30 may extend in a vertical or substantially vertical direction downwardly from the first surface 21 to the second surface 22 substantially at right angles to the exposed surface, as shown in FIG. 2A. Anisotropic etching processes, laser ablation, mechanical removal processes, e.g., milling, ultrasonic machining, directing a jet of fine abrasive particles towards the substrate 20, reactive ion etching, or plasma etching, among others, can be used to form openings 30 having essentially vertical inner surfaces.

Alternatively, instead of being substantially at right angles to the exposed surface, the inner surfaces 31 of the openings 30 may be sloped, i.e., may extend at angles other a normal angle (right angle) to the exposed surface. Wet etching processes, e.g., isotropic etching processes and sawing using a tapered blade, among others, can be used to form openings 30 having sloped inner surfaces 31. Laser ablation, mechanical milling, chemical etching, plasma etching, directing a jet of fine abrasive particles towards the substrate 20, among others, can also be used to form the openings 30 (or any other hole or opening described herein) having sloped inner surfaces 31.

Figure 2B:
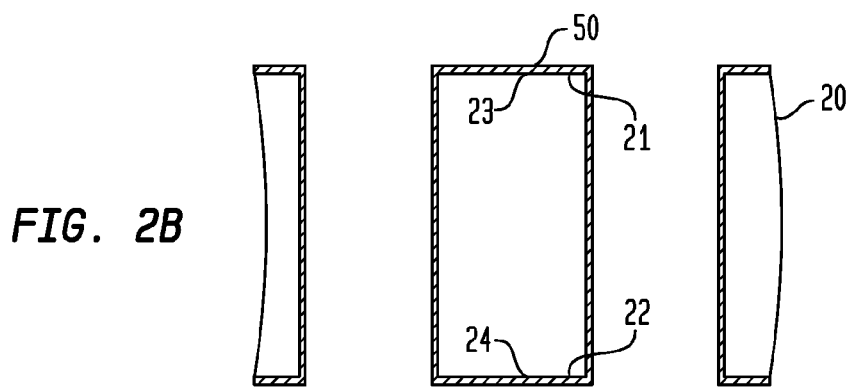

Thereafter, as illustrated in FIG. 2B, an insulating dielectric layer 50 can be formed on the inner surface 31 of each through opening 30 and on portions of the first surface 21 and the second surface 22 of the substrate 20, including portions 23 and 24 along the first and second surfaces between the through openings 30a and 30b. Various methods can be used to form the insulating dielectric layer 50. In one example, a flowable dielectric material can be applied to the first surface 21 of the substrate 20, and the flowable material can then more evenly distributed across the exposed surface during a "spin-coating" operation, followed by a drying cycle which may include heating. In another example, a thermoplastic film of dielectric material can be applied to the first surface 21 after which the assembly is heated, or is heated in a vacuum environment, i.e., placed in an environment under lower than ambient pressure. In another example, vapor deposition can be used to form the insulating dielectric layer 50.

In still another example, the assembly including the substrate 20 can be immersed in a dielectric deposition bath to form a conformal dielectric coating or insulating dielectric layer 50. As used herein, a "conformal coating" is a coating of a particular material that conforms to a contour of the surface being coated, such as when the insulting dielectric layer 50 conforms to a contour of the inner surface 31 of the openings 30. An electrochemical deposition method can be used to form the conformal dielectric layer 50, including for example, electrophoretic deposition or electrolytic deposition.

In one example, an electrophoretic deposition technique can be used to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric layer 50 on exposed surfaces of the substrate which are conductive or semiconductive, including but not limited to along the inner surface 31 of the openings 30. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly. In addition, the electrophoretic coating can be deposited so that it does not form on a remaining passivation layer overlying the first surface 21 of the substrate 20, due to its dielectric (nonconductive) property. Stated another way, a property of electrophoretic deposition is that it does not normally form on a layer of dielectric material, and it does not form on a dielectric layer overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer 50 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

| ECOAT NAME | ELECTROLAC | LECTRASEAL DV494 | LECTROBASE 101 |
|---|---|---|---|
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

Figure 2C:
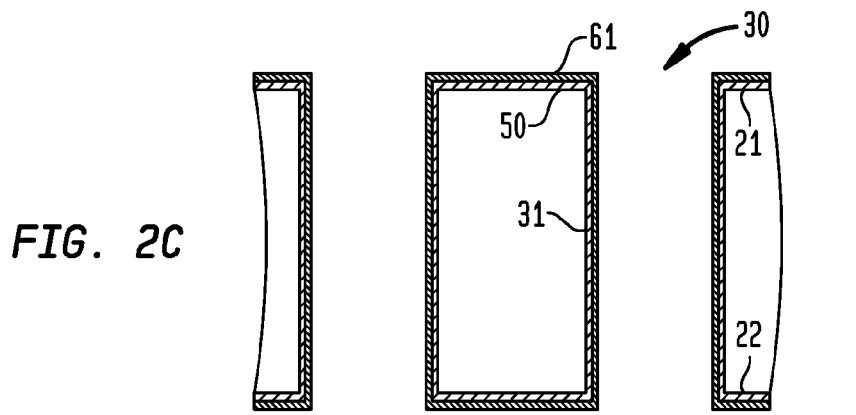

Thereafter, as illustrated in FIG. 2C, the first conductive plate 61 can be formed overlying the insulating dielectric layer 50, at least within the through openings 30, such that a contour of the first plate conforms to contours of the inner surface 31 and portions of the first and second surfaces 21 and 22.

To form the first plate 61 (and any of the other conductive elements described herein), an exemplary method involves depositing a metal layer by one or more of sputtering a primary metal layer onto exposed surfaces of the substrate and the openings 30, plating, or mechanical deposition. Mechanical deposition can involve the directing a stream of heated metal particles at high speed onto the surface to be coated. This step can be performed by blanket deposition onto the first surface 21, the second surface 22, and the inner surfaces 31, for example. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the first plate 61 (and any of the other conductive elements described herein). In particular examples, a stack including a plurality of metal layers can be formed on one or more of the afore-mentioned surfaces. For example, such stacked metal layers can include a layer of titanium followed by a layer of copper overlying the titanium (Ti—Cu), a layer of nickel followed by a layer of copper overlying the nickel layer (Ni—Cu), a stack of nickel-titanium-copper (Ni—Ti—Cu) provided in similar manner, or a stack of nickel-vanadium (Ni—V), for example.

Figure 2D:
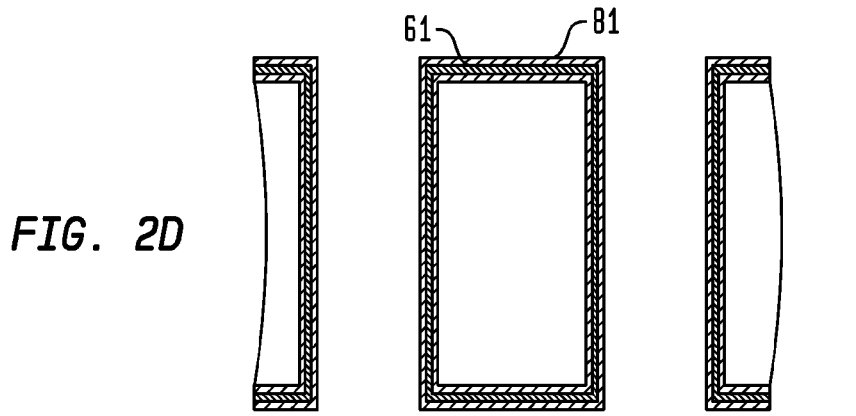
Figure 2E:
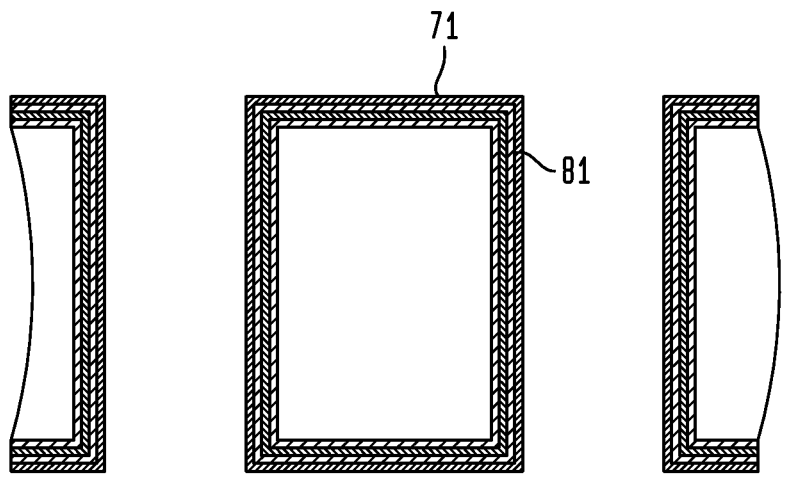

Thereafter, as illustrated in FIG. 2D, the first capacitor dielectric layer 81 can be formed overlying the first conductive plate 61. The first capacitor dielectric layer 81 can be formed using similar methods as described above with reference to the insulating dielectric layer 50 (FIG. 2B). Thereafter, as illustrated in FIG. 2E, the third conductive plate 71 can be formed overlying the first capacitor dielectric layer 81. The third conductive plate 71 can be formed using similar methods as those described above with reference to the first conductive plate 61 (FIG. 2C).

Figure 2F:
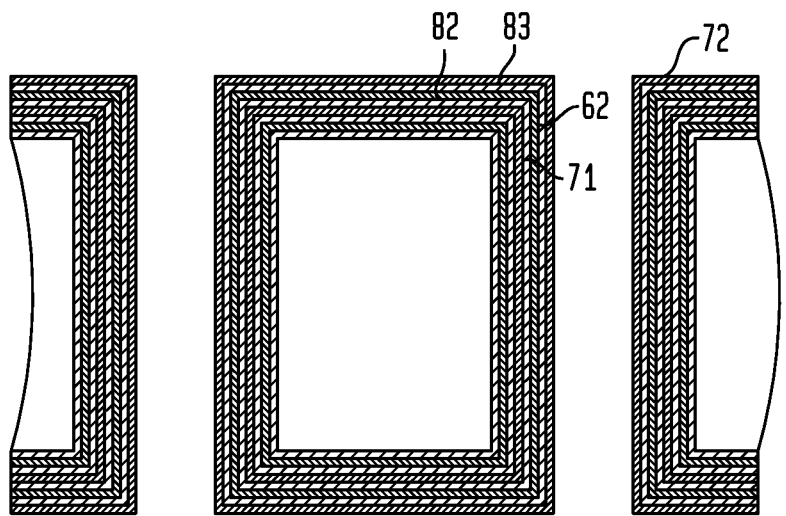

Thereafter, as illustrated in FIG. 2F, the second capacitor dielectric layer 82 can be formed overlying the third conductive plate 71, the second conductive plate 62 can be formed overlying the second capacitor dielectric layer, the third capacitor dielectric layer 83 can be formed overlying the second conductive plate, and the fourth conductive plate can be formed overlying the third capacitor dielectric layer. The second and third capacitor dielectric layers 82 and 83 can be formed using similar methods as described above with reference to the insulating dielectric layer 50 (FIG. 2B). The second and fourth conductive plates 62 and 72 can be formed using similar methods as those described above with reference to the first conductive plate 61 (FIG. 2C).

Figure 2G:
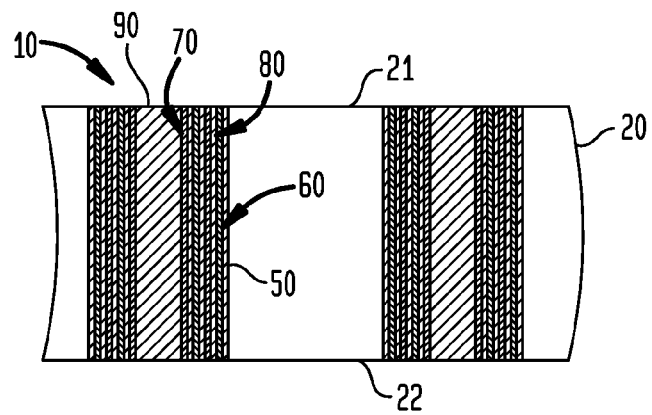

Thereafter, as illustrated in FIG. 2G, the dielectric region 90 can be formed inside each through opening 30. The dielectric region 90 can include an inorganic material, a polymeric material, or both. Then, the first and second pairs of plates 60 and 70, the dielectric layers 50 and 80, and the dielectric region 90 can be planarized with the first and second surfaces 21 and 22 of the substrate 20. For example, grinding, lapping, or polishing of the first and second surfaces 21 and 22 or a combination thereof can be used to planarize the component 10.

Figure 2H:
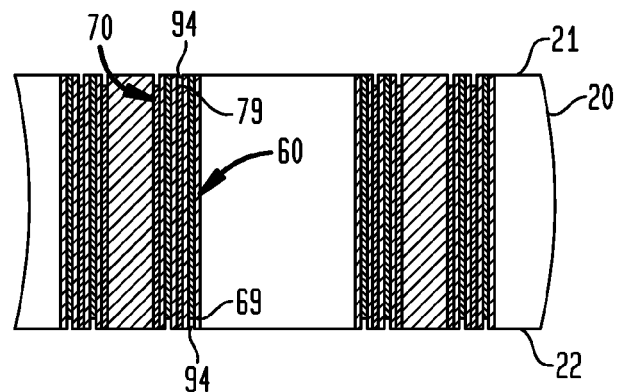

Thereafter, as illustrated in FIG. 2H, the distal edges 69 and 79 of the respective first and second pairs of plates 60 and 70 can be partially recessed below the planes defined by the respective second and first surfaces 22 and 21 of the substrate 20 by removing a portion of the material from the first and second pairs of plates adjacent the respective second and first surfaces, thereby forming a plurality of recesses 94 extending between the distal edges 69 and 79 and the respective second and first surfaces. The target portions of the material can be removed, for example, by selectively etching the first and second plates 60 and 70. The target portions of the material can alternatively be removed using similar methods as those described above with reference to removal of material from the substrate 20 (FIG. 2A).

The distal edges 69 of the first pair of plates 60 can be recessed below the second surface 22 so that the first pair of plates does not contact the second electrode 73 when it is later formed at the second surface (FIG. 1A), and the distal edges 79 of the second pair of plates 70 can be recessed below the first surface 21 so that the second pair of plates does not contact the first electrode 63 when it is later formed at the first surface (FIG. 1A).

Figure 2I:
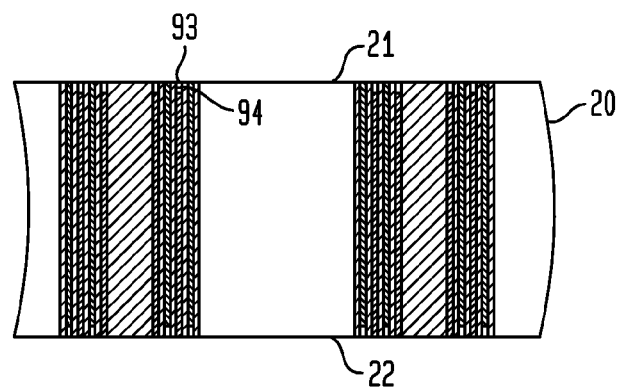

Thereafter, as illustrated in FIG. 2I, the dielectric portions 93 can each be formed within a respective recess 94, and the dielectric portions can be planarized with the first and second surfaces 21 and 22 of the substrate 20. For example, grinding, lapping, or polishing of the first and second surfaces 21 and 22 or a combination thereof can be used to planarize the dielectric portions 93. Alternatively, a self-planarizing dielectric material can be used to form the dielectric portions 93.

Figure 2J:
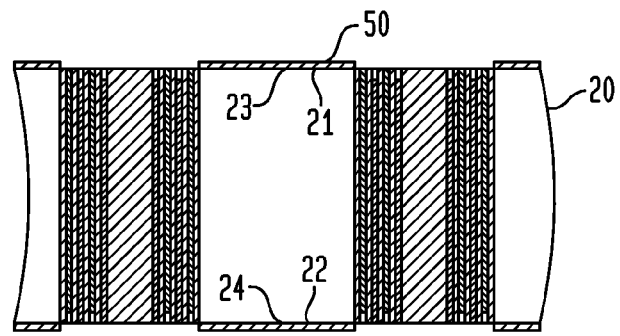

Thereafter, as illustrated in FIG. 2J, the portions of the insulating dielectric layer 50 that may have been removed during the step illustrated in FIG. 2G can be reformed on portions of the first and second surfaces 21 and 22 of the substrate 20, including portions 23 and 24 along the first and second surfaces between the through openings 30a and 30b. The portions of the insulating dielectric layer 50 can be formed, for example, using similar methods as those described above with respect to FIG. 2B.

Thereafter, referring again to FIG. 1A, the first and second electrodes 63 and 73 can be formed at the respective first and second surfaces 21 and 22 of the substrate 20. The first electrode 63 can be formed at the first surface 21 such that the first electrode is connected to the first pair of plates 60, but such that the first electrode is spaced apart from the distal ends 79 of the second pair of plates 70 by the plurality of dielectric portions 93b. The second electrode 73 can be formed at the second surface 22 such that the second electrode is connected to the second pair of plates 70, but such that the second electrode is spaced apart from the distal ends 69 of the first pair of plates 60 by the plurality of dielectric portions 93a. Each of the first and second electrodes 63 and 73 can be formed such that they at least partially overlie the portions 23 and 24 of the substrate 20 between the through openings 30a and 30b. The first and second electrodes 63 and 73 can be formed, for example, using similar methods as those described above with respect to FIG. 2C.

With reference to FIG. 3, a component 310 according to an embodiment of the present invention includes a substrate 320 and a capacitor 340 formed in contact with the substrate. The substrate 320 has a through opening 330 extending through the substrate between a planar first surface 321 and a planar second surface 322 opposite the first surface. The capacitor 340 includes an insulating dielectric layer 350 overlying substrate boundary surfaces 331 (or inner surfaces) of the opening 330 and portions of the first and second surfaces 321 and 322, first and second electrically conductive elements or metal elements 360 and 370 (or first and second metal elements), and a capacitor dielectric layer 380 separating the first and second electrically conductive elements and having an undulating shape.

The substrate 320, the through opening 330, the substrate boundary surfaces 331 (or inner surfaces) of the through opening, and the insulating dielectric layer 350 are similar to the corresponding elements of the component 10 disclosed above with reference to FIGS. 1A through 2J.

The first electrically conductive element 360 includes a first plurality of vertically-extending plates 361 overlying the insulating dielectric layer 350 within the opening 330. At the first surface 321 of the substrate 320, the first plurality of plates 361 can be connected to a single first electrode 363 exposed at the first surface, the first electrode being connectable with a first electric potential. Each of the first plates 361 can have a width in a direction along the first surface 321 of at least 5 microns. The first electrode 363 can optionally be a plurality of electrodes exposed at the first surface, such that a portion of the first conductive element 360 extending between the plurality of electrodes can be covered by an overlying insulating dielectric layer except where exposed for interconnection with another element external to the capacitor 340.

The second electrically conductive element 370 includes a second plurality of vertically-extending plates 371, each second plate extending between adjacent ones of the first plates

361. At the second surface 322 of the substrate 320, the second plurality of plates 371 can be connected to a single second electrode 373 exposed at the second surface, second electrode being connectable with a second electric potential. Each of the second plates 371 can have a width in a direction along the first surface 321 of at least 5 microns. The second electrode 373 can optionally be a plurality of electrodes exposed at the second surface, such that a portion of the second conductive element 370 extending between the plurality of electrodes can be covered by an overlying insulating dielectric layer except where exposed for interconnection with another element external to the capacitor 340. In a particular embodiment, one or more of the first and second electrodes 363 and 373 can be electrically connected to the respective first and second conductive elements 360 and 370 by conductive traces extending therebetween.

The capacitor dielectric layer 380 can separate and insulate the first and second electrically conductive elements 360 and 370 from one another. The capacitor dielectric layer 380 can have an undulating shape, at least within the opening 330. As used herein, a capacitor dielectric layer having an "undulating" shape means that the dielectric layer has a wavelike shape, such that an imaginary line 301 parallel to a direction of undulation (e.g., the "X" direction in FIG. 3) intersects the dielectric layer at least three times. In a particular embodiment, an undulating first surface 336 and an undulating second surface 338 of the capacitor dielectric layer 380 (and the other undulating dielectric layers described herein) each have a length along the respective surfaces at least triple the height H of the opening 330 between the first and second surfaces 331 and 332.

In particular examples, the first and second pluralities of plates 361 and 371 can have planar shapes extending substantially parallel to one another, annular shapes extending within an opening 330 having a circular or oval cross-sectional shape, post or finger shapes extending substantially parallel to one another, or a mesh shape including a plurality of post-shaped openings. Such examples are described in more detail below with reference to FIGS. 5B, 5C, and 5D.

Figure 4E:
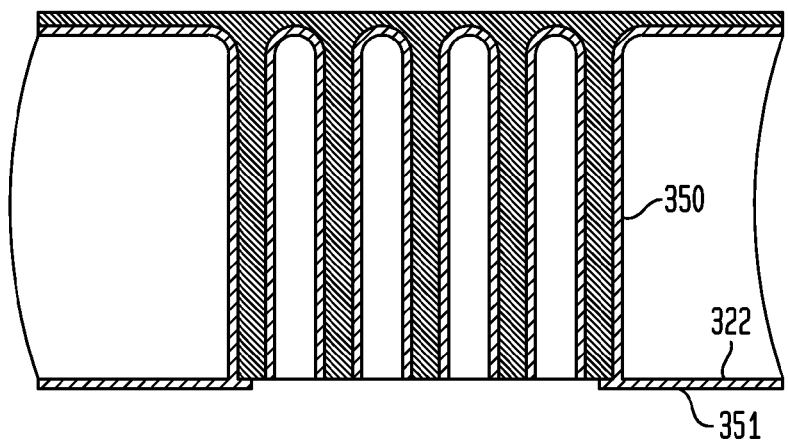

A method of fabricating the component 310 (FIG. 3) will now be described, with reference to FIGS. 4A-4G. As illustrated in FIG. 4A, material can be removed from the first surface 321 of the substrate 320 to form a plurality of first openings 334 extending from the first surface towards the second surface 322, the first openings defining an undulating inner surface 335 and substrate boundary surfaces 331. The substrate boundary surfaces 331 define portions of the exposed surfaces within the first openings 334 that will later form the boundary of the through opening 330 (FIG. 3). The first openings 334 can be formed using similar methods as those described above with respect to FIG. 2A.

Thereafter, as illustrated in FIG. 4B, an insulating dielectric layer 350 and a capacitor dielectric layer 380 can be formed. The insulating dielectric layer 350 can be formed overlying the substrate boundary surfaces 331 and portions of the first surface 321, and the capacitor dielectric layer 380 can be formed overlying the undulating inner surface 335. The capacitor dielectric layer 380 has an undulating first surface 336 facing away from the inner surface 335. The dielectric layers 350 and 380 can be formed using similar methods as those described above with respect to FIG. 2B. In a particular embodiment, the dielectric layers 350 and 380 can be made from the same dielectric material, for example, during a single formation process. In another embodiment, the dielectric layers 350 and 380 can be made from different dielectric materials, for example, during separate formation processes.

Thereafter, as illustrated in FIG. 4C, the first electrically conductive element 360 can be formed overlying the undulating first surface 336 and extending into each of the first openings 334. The first electrically conductive element 360 can include the first plurality of vertically-extending plates 361 and the first electrode 363, the first electrode being exposed at the first surface 321. The first conductive element 360 can be formed using similar methods as those described above with respect to FIG. 2C.

In a particular embodiment, before forming the first electrically conductive element 360, a mask layer (not shown) can be applied to the first surface 321 of the substrate 320 overlying a first subset of the plurality of first openings 334 where it is desired to deposit the first conductive element. For example, the mask layer can be a photoimageable layer, e.g., a photoresist layer, which can be deposited and patterned to cover only portions of the first surface 321. In such an embodiment, a second subset of the plurality of first openings 334 can be filled with a dielectric material such as epoxy or another polymer. In one embodiment, the dielectric material can be compliant. After the second subset of the plurality of first openings 334 is filled with the dielectric material, the mask layer can be removed, and the first conductive element 360 can be deposited into the first subset of the plurality of first openings. In one example, some of the second subset of the plurality of first openings 334 can be partially filled with a plug of dielectric material near the first surface 321, such that a void that can be filled with air remains inside a portion of each of the second subset of the plurality of first openings. Such a second subset of the plurality of first openings 334 that does not contain metal can reduce the effective CTE of the capacitor 340 so that such a capacitor can experience a reduced amount of pumping, for example.

Thereafter, as illustrated in FIG. 4D, the thickness of the substrate 320 between the first and second surfaces 321 and 322 can be reduced, thereby exposing distal edges 369 of the first plurality of plates 361. Grinding, lapping, or polishing of the second surface 322 or a combination thereof can be used to reduce the thickness of the substrate 320. During this step, as an example, the initial thickness T1 (shown in FIG. 4C) of the substrate 320 can be reduced from about 700 µm to a thickness T2 (shown in FIG. 4D) of about 130 µm or less.

Figure 4F:
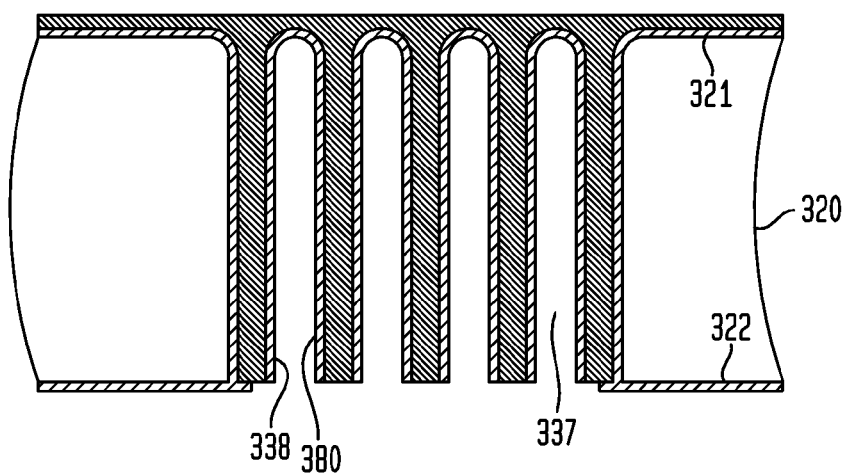

Thereafter, as illustrated in FIG. 4E, additional portions 351 of the insulating dielectric layer 350 can be formed overlying the second surface 322, except at portions of the second surface where it is desired to form a plurality of second openings 337 (FIG. 4F). The additional portions 351 of the insulating dielectric layer 350 can be formed using similar methods as those described above with respect to FIG. 2B.

Thereafter, as illustrated in FIG. 4F, material can be removed from the second surface 322 of the substrate 320 to expose an undulating second surface 338 of the capacitor dielectric layer 380, thereby forming the plurality of second openings 337 extending from the second surface towards the first surface 321. The second openings 337 can be formed using similar methods as those described above with respect to FIG. 2A.

Figure 4G:
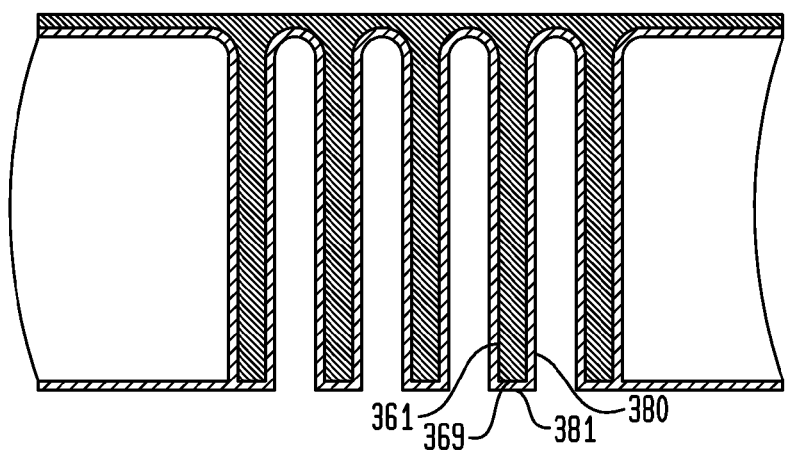

Thereafter, as illustrated in FIG. 4G, additional portions 381 of the capacitor dielectric layer 380 can be formed overlying the distal edges 369 of the first plurality of plates 361. The additional portions of the dielectric layer 380 can be formed using similar methods as those described above with respect to FIG. 2B.

Thereafter, referring again to FIG. 3, the second electrically conductive element 370 can be formed overlying the second surface 338 of the capacitor dielectric layer 380 and extending into each of the second openings 337. The second electrically conductive element 370 can include the second plurality of vertically-extending plates 371 and the second electrode 373, the second electrode being exposed at the second surface 322. The second conductive element 370 can be formed using similar methods as those described above with respect to FIG. 2C.

In a particular embodiment, before forming the second electrically conductive element 370, a mask layer (not shown) can be applied to the second surface 322 of the substrate 320 overlying a first subset of the plurality of second openings 337 where it is desired to deposit the second conductive element. In such an embodiment, a second subset of the plurality of second openings 337 can be filled with a dielectric material such as epoxy or another polymer. In one embodiment, the dielectric material can be compliant. After the second subset of the plurality of second openings 337 is filled with the dielectric material, the mask layer can be removed, and the second conductive element 370 can be deposited into the first subset of the plurality of second openings. In one example, some of the second subset of the plurality of second openings 337 can be partially filled with a plug of dielectric material near the second surface 322, such that a void that can be filled with air remains inside a portion of each of the second subset of the plurality of second openings. Such a second subset of the plurality of second openings 337 that does not contain metal can reduce the effective CTE of the capacitor 340 so that such a capacitor can experience a reduced amount of pumping, for example.

FIG. 5A illustrates a variation of the component of FIG. 3 having an alternate configuration. The component 510 is similar to the component 310 described above, except that the component 510 includes a first electrically conductive element or metal element 560 having a first plurality of vertically-extending portions 561, each of the first plurality of portions having a rounded distal edge 569 that is recessed below the second surface 522. The second electrically conductive element or metal element 570 has vertically-extending portions 571.

The through opening 530 can have any top-view shape, including for example, circular (e.g., FIG. 1B), oval (e.g., FIG. 5C), square, rectangular (e.g., FIGS. 1B, 5B, and 5D), or other shapes. In some examples, the through opening 530 can have any three-dimensional shape, including for example, a cylinder, a cube, a prism, or a frustoconical shape, among others.

The first and second conductive elements 560 and 570 can have various possible cross-sectional shapes, as shown, for example, in FIGS. 5B, 5C, and 5D. In a particular embodiment, as seen in FIG. 5B, the first and second conductive elements 560 and 570 have respective first and second pluralities of portions 561 and 571, which have planar shapes extending substantially parallel to one another and to the substrate boundary surfaces 531 of an opening 530 having a square or rectangular cross-sectional shape. In one embodiment, the first and second pluralities of portions 561 and 571 can have annular shapes extending within an opening 530 having a circular or oval cross-sectional shape, such as in the example shown in FIG. 5C.

Alternatively, in the example embodiment shown in FIG. 5D, the vertically-extending portions of the second conductive element 570 can be a plurality of posts or fingers 571 arranged in an m×n array, each of m and n being greater than 1. In one example, the posts 571 fill every position within the m×n array. Typically, m and n are both large, and each can number above 10, or even above 100 in some cases. In another example, the posts 571 can be arranged to fill a first plurality of positions within the m×n array, and a second plurality of positions within the m×n array can be occupied by an insulating dielectric material. Each post 571 can extend into the through opening 530 in a vertical direction V1 (FIG. 5A) substantially perpendicular to the first surface 521 of the substrate 520. In one example, each post 571 can be parallel to one or more adjacent posts. As used here, "parallel" refers to axes extending through the structures' centroids being parallel or substantially parallel within an allowed tolerance, even if edges of the "parallel" structures are not entirely parallel. In one embodiment, each post 571 does not extend above the first surface 521 or below the second surface 522 of the substrate 520 in the vertical direction V1.

Also shown in FIG. 5D, the first conductive element 560 can have a mesh shape, such that vertically-extending portions 561 of the first conductive element may surround individual ones of the posts 571 of the second conductive element. In a particular embodiment, each post 571 can be completely surrounded by the first conductive element 560, such that each post 571 extends within a corresponding one of a plurality of openings 562 extending vertically within the first conductive element 560.

Figure 5E:
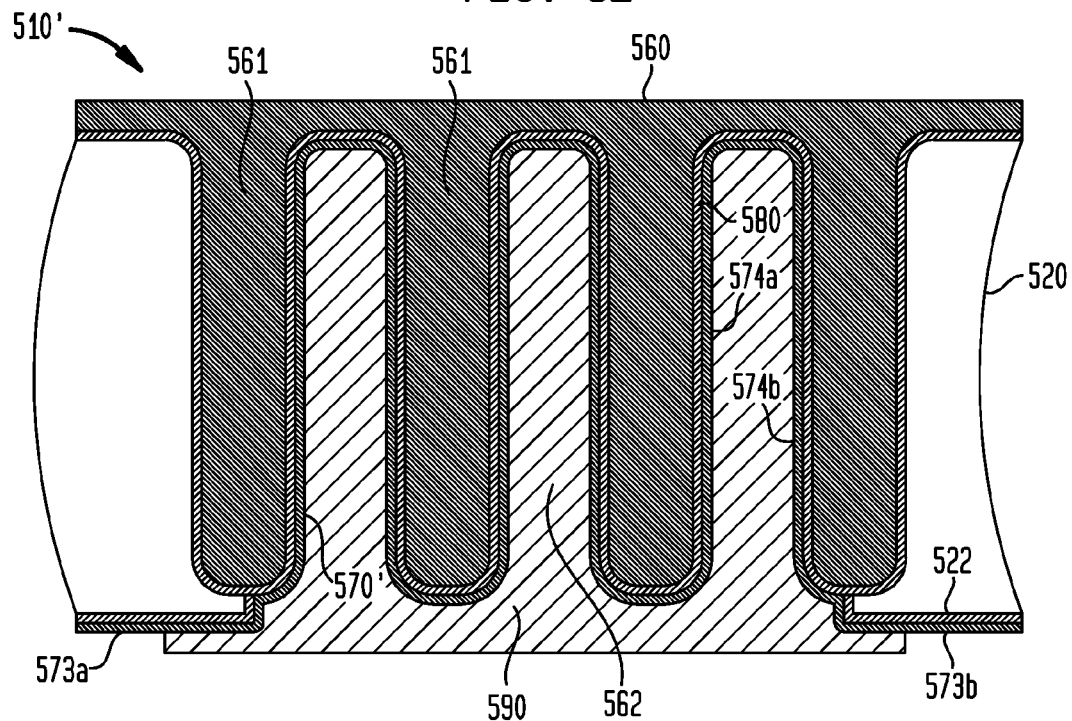
FIG. 5E is a sectional view illustrating a capacitor in accordance with still another embodiment.

FIG. 5E illustrates a variation of the component of FIG. 5A having an alternative configuration. The component 510' is similar to the component 510 described above, except that the second electrically conductive element or metal element 570' is a metal layer that has a surface that conforms to a contour of the surface of the capacitor dielectric layer 580, and the component 510' includes a dielectric region 590 overlying the second metal element and filling the portions of the openings 562 extending within the first conductive element 560 that are not occupied by the second metal element.

The dielectric region 590 separates a first substantially vertically-extending portion 574a of the second electrically conductive element 570' from an adjacent second substantially vertically-extending portion 574b thereof that is substantially parallel to the first portion. At the second surface 522 of the substrate 520, the second electrically conductive element 570 can be connected to electrodes 573a and 573b exposed at the second surface, the first and second electrodes being connectable with an electric potential.

The first metal element 560 and the second metal element 570' of the component 510' shown in FIG. 5E can have a similar geometric configuration as the first and second metal elements shown in FIGS. 5B, 5C, and 5D, wherein the first and second substantially vertically-extending portions 574a and 574b of the second metal element 570' can have a planar shape (similar to FIG. 5B), a substantially annular shape (similar to FIG. 5C), or adjacent portions 574a and 574b can together form a vertically-extending post shape (similar to FIG. 5D) extending into openings 562 extending within a mesh-shaped first conductive element 560.

In a particular embodiment, the first metal element 560 can have vertically-extending posts 561 (similar to the posts 571 in FIG. 5D) extending into openings within a mesh-shaped second conductive element 570'. In a variation of the embodiment shown in FIG. 5E, instead of the configuration as described above, the vertically-extending portions of the second metal element 570' can extend within openings in a mesh-shaped first metal element 560 such that the vertically-extending portions are hollow posts.

Figure 5F:
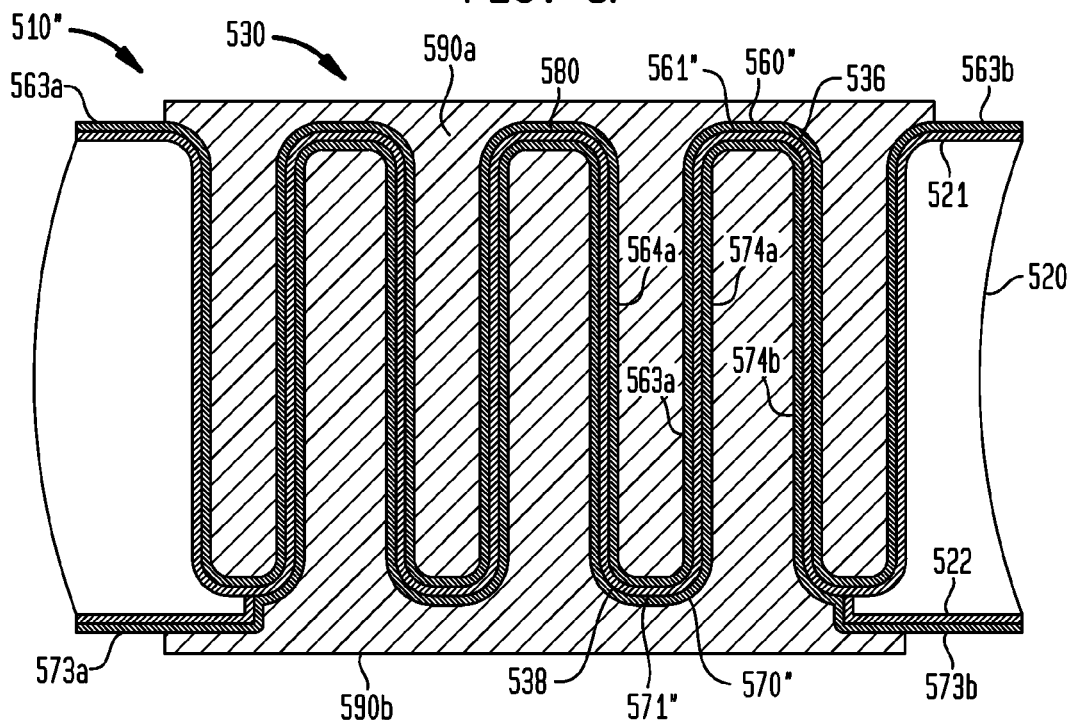
FIG. 5F is a sectional view illustrating a capacitor in accordance with another embodiment.

FIG. 5F illustrates a variation of the component of FIG. 5E having an alternate configuration. The component 510" is similar to the component 510' described above, except that the component 510" includes first and second electrically conductive elements 560" and 570" (or first and second metal elements) having surfaces that conform to a contour of the surface of the capacitor dielectric layer 580, whereby dielectric regions 590a and 590b (collectively dielectric regions 590) fill a portion of the opening 530 that is not occupied by the first and second electrically conductive elements and the capacitor dielectric layer.

The first electrically conductive element 560" has a first surface 561" that overlies and conforms to a contour of a first surface 536 of the capacitor dielectric layer 580. A first dielectric region 590a fills a portion of the opening 530 that is not occupied by the first and second electrically conductive elements and the capacitor dielectric layer 580, whereby the first dielectric region separates a first portion 564a of the first electrically conductive element 560" from an adjacent second portion 564b thereof that is substantially parallel to the first portion. At the first surface 521 of the substrate 520, the first electrically conductive element 560" can be connected to first and second electrodes 563a and 563b exposed at the first surface, the first electrode being connectable with a first electric potential.

The second electrically conductive element 570" has a second surface 571" that overlies and conforms to a contour of a second surface 538 of the capacitor dielectric layer 580". A second dielectric region 590b fills a portion of the opening 530 that is not occupied by the first and second electrically conductive elements and the capacitor dielectric layer, whereby the second dielectric region separates a first portion 574a of the second electrically conductive element 570" from an adjacent second portion 574b thereof that is substantially parallel to the first portion. At the second surface 522 of the substrate 520, the second electrically conductive element 570" can be connected to third and fourth electrodes 573a and 573b" exposed at the second surface, the second electrode being connectable with a second electric potential.

In particular examples, the first metal element 560" and the second metal element 570" of the component 510" shown in FIG. 5F can have similar geometric configurations to the first and second metal elements shown in FIG. 5B or 5C, wherein substantially vertically-extending portions 564a and 564b of the first metal element 560' and substantially vertically-extending portions 574a and 574b of the second metal element 570' can have a substantially planar shape (similar to FIG. 5B) or a substantially annular shape (similar to FIG. 5C).

Alternatively, adjacent portions 574a and 574b can be portions of a substantially vertically-extending hollow post shape similar to the hollow post portions 570' described above (FIG. 5E) extending into downward-facing openings extending within a mesh-shaped first conductive element 560".

Figure 6A:
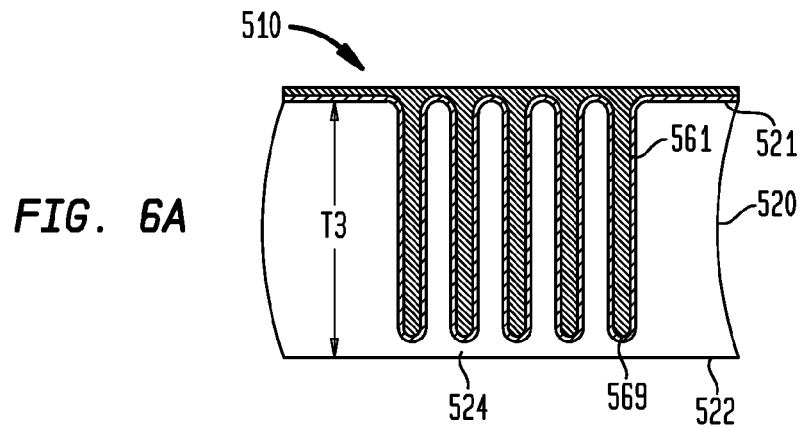
FIGS. 6A-6D are sectional views illustrating stages of fabrication in accordance with the embodiment of the invention depicted in FIG. 5A.

A method of fabricating the component 510 (FIG. 5A) will now be described, with reference to FIGS. 6A-6D. The method of fabricating the component 510 can begin with the steps described above with reference to the component 310 shown in FIGS. 4A-4C. Thereafter, as illustrated in FIG. 6A, the thickness of the substrate 520 between the first and second surfaces 521 and 522 can be reduced. However, the distal edges 569 of the first plurality of portions 561 are not exposed, whereby a portion 524 of the substrate remains between the distal edges of the first plurality of plates and the second surface 522. Grinding, lapping, or polishing of the second surface 522 or a combination thereof can be used to reduce the thickness of the substrate 520. During this step, as an example, the initial thickness T1 (shown in FIG. 4C) of the substrate 520 can be reduced from about 700 μm to a thickness T3 (shown in FIG. 6A) of about 130 μm or less.

Figure 6B:
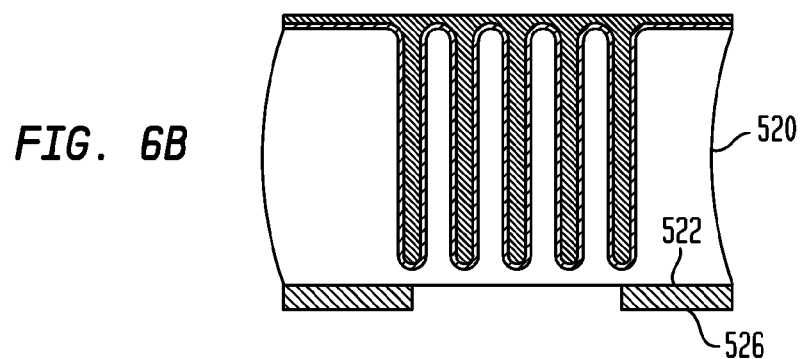

Thereafter, as illustrated in FIG. 6B, a mask layer 526 can be applied to the second surface 522 of the substrate 520 where it is desired to preserve remaining portions of the second surface. For example, the mask layer 526 can be a photoimageable layer, e.g., a photoresist layer, which can be deposited and patterned to cover only portions of the second surface 522.

Figure 6C:
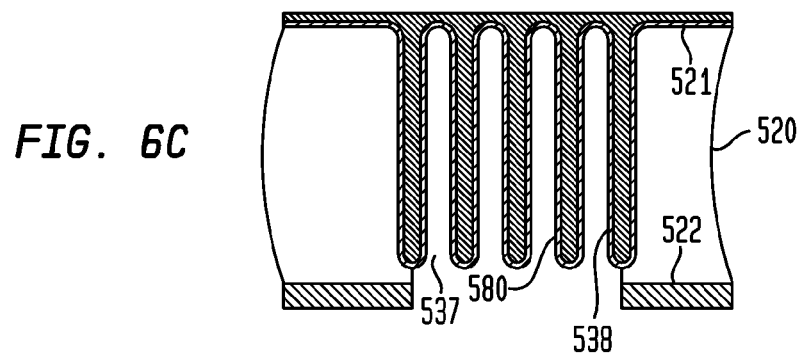

Thereafter, as illustrated in FIG. 6C, material can be removed from the second surface 522 of the substrate 520 to expose an undulating second surface 538 of the capacitor dielectric layer 580, thereby forming the plurality of second openings 537 extending from the second surface towards the first surface 521. The second openings 537 can be formed using similar methods as those described above with respect to FIG. 2A.

Figure 6D:
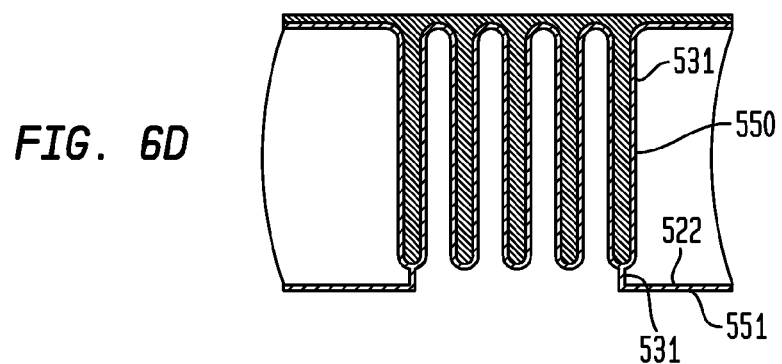

Thereafter, as illustrated in FIG. 6D, the mask layer 526 can be removed, and additional portions 551 of the insulating dielectric layer 550 can be formed overlying the second surface 522 and exposed portions 531 of the substrate boundary surfaces 531. The additional portions 551 of the insulating dielectric layer 550 can be formed using similar methods as those described above with respect to FIG. 2B.

Thereafter, referring again to FIG. 5A, the second electrically conductive element 570 can be formed overlying the second surface 538 of the capacitor dielectric layer 580 and extending into each of the second openings 537. The second electrically conductive element 570 can include the second plurality of vertically-extending portions 571 and the second electrode 573, the second electrode being exposed at the second surface 522. The second conductive element 570 can be formed using similar methods as those described above with respect to FIG. 2C.

To fabricate the component 510' (FIG. 5E) or 510" (FIG. 5F), the same method can be used as described with reference to FIGS. 6A-6D, except that one or more of the first and second electrically conductive elements can be a conformal metal layer that is deposited overlying a surface of the capacitor dielectric layer 580. The conformal metal layers can be formed using similar methods as those described above with respect to FIG. 2C. Also, one or more dielectric regions 590 can be deposited into portions of the opening 530 that is not occupied by the first and second electrically conductive elements and the capacitor dielectric layer 580. Such dielectric regions 590 can be formed using similar methods as those described above with respect to FIG. 2B.

Figure 7A:
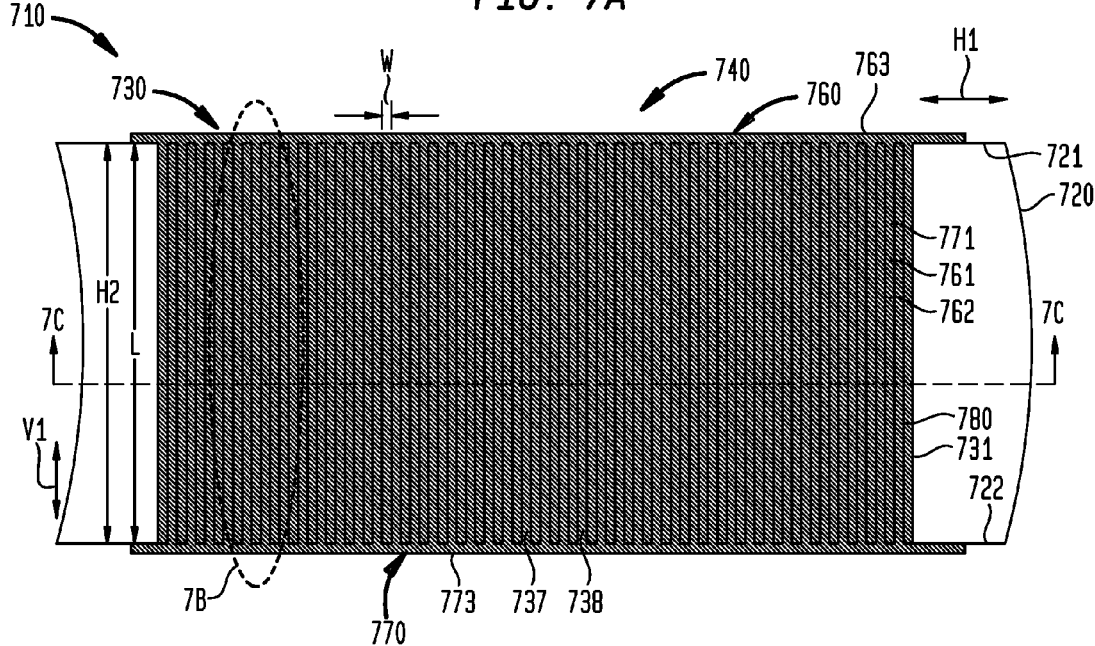
FIG. 7A is a sectional view illustrating a capacitor in accordance with yet another embodiment.

FIG. 7A illustrates another variation of the component of FIG. 3. The component 710 is similar to the component 310 described above, except that the component 710 includes a silicon substrate 720, a first electrically conductive element or metal element 760 having a plurality of vertically-extending posts 761 arranged in an m×n array, and a second conductive element or metal element 770 having portions disposed between adjacent ones of the plurality of posts. The second conductive element 770 may surround individual ones of the posts 761, such that the posts extend within openings defined by the second conductive element.

The substrate 720 can have a through opening 730 extending through the substrate between a planar first surface 721 and a planar second surface 722 opposite the first surface. The capacitor 740 can include first and second electrically conductive elements or metal elements 760 and 770 (or first and second metal elements) exposed at the respective first and second surfaces 721, 722 and extending into the through opening 730, and a capacitor dielectric layer 780 separating the first and second electrically conductive elements from one another at least within the through opening.

Figure 7B:
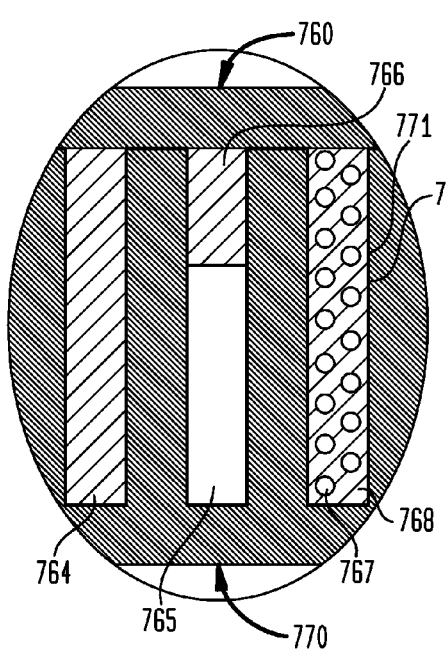
FIG. 7B is an enlarged fragmentary sectional view illustrating a portion of the capacitor of FIG. 7A.

The first electrically conductive element 760 can include a plurality of posts 761 arranged in an m×n array, each of m and n being greater than 1. In one example, the posts 761 can be arranged to fill a first plurality of positions within the m×n array, and a second plurality of positions within the m×n array can be occupied by an insulating dielectric material 764, as shown in FIG. 7B. In a particular example, also shown in FIG. 7B, a second plurality of positions within the m×n array can include a continuous void 765 extending at least 50% of a height H2 of the through opening 730, and an insulating dielectric material 766 can be disposed between the void and the metal element 760. In a further example, shown in FIG. 7B, each of a second plurality of positions within the m×n array can include voids 767 accounting for at least 50% of an internal volume of an opening 771 within the second conductive element 770 corresponding to the respective position within the through opening 730, and the voids can be interspersed throughout some or all of a dielectric material 768.

The aforementioned variations for occupying the second plurality of positions within the m×n array are shown in FIG. 7B in place of the downwardly-extending posts 761 of the metal element 760 that are shown in FIG. 7A. The openings 771 in the second conductive element 770 are shown in FIG. 7B with a reduced height-to-width ratio compared to FIG. 7A for easier viewing of the variations for occupying the second plurality of positions within the m×n array.

Figure 7C:
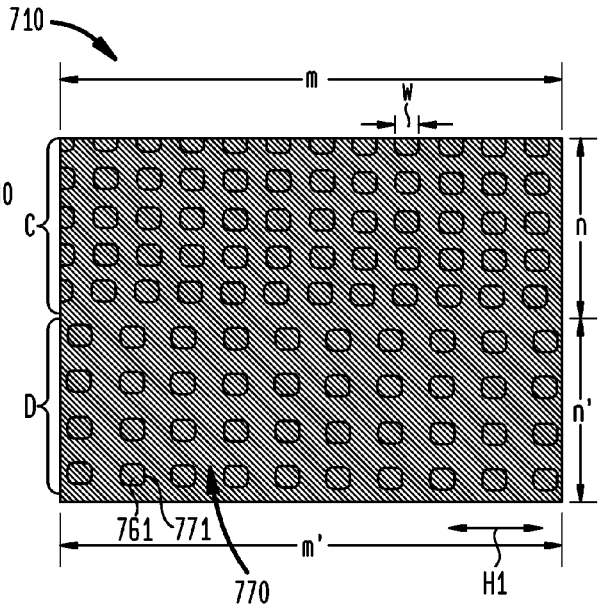
FIG. 7C is an enlarged fragmentary sectional view of a portion of the capacitor depicted in FIG. 7A, taken across the line 7C-7C.

In a particular embodiment, as shown in FIG. 7C, the plurality of posts 761 can be arranged in more than one array, including an m×n array in a region C of the component 710 and an m'×n' array in a region D of the component, where m can be the same or different than m' and n can be the same or different than n'. In one example, where m is the same as m' and n is the same as n', the m×n array can be offset from the n'×m' array in a horizontal direction H1 substantially parallel to the first surface 721 of the substrate 720.

Each post 761 can extend into the through opening 730 in a vertical direction V1 substantially perpendicular to the first surface 721 of the substrate 720. In one example, each post can include a substantially vertical portion 762 that is substantially parallel to a corresponding substantially vertical portion of at least one adjacent post. In a particular embodiment, each of the plurality of posts 761 can have a width W in the horizontal direction H1 of 5 microns or less. Each of post 761 can have a length L in the vertical direction. In one embodiment, the ratio of the length L to the width W of each post 761 can be at least 10. In a particular example, the length of each post 761 can be at least 150 microns. In another example, the plurality of posts 761 can define a pitch in the horizontal plane of 10 microns or less. In one embodiment, each post 761 does not extend above the first surface 721 or below the second surface 722 of the substrate 720 in the vertical direction V1.

At the first surface 721 of the substrate 720, the first conductive element 760 can be connected to a single first electrode 763 exposed at the first surface, the first electrode being connectable with a first electric potential. The first electrode 763 can optionally be a plurality of electrodes exposed at the first surface, such that a portion of the first electrode extending between the plurality of electrodes can be covered by an overlying insulating dielectric layer except where exposed for interconnection with another element external to the capacitor 740.

The second electrically conductive element 770 has portions disposed between adjacent ones of the plurality of posts 761. In one example, as shown in FIG. 7C, the second conductive element 770 can have a mesh shape, such that the second conductive element may surround individual ones of the posts 761. In a particular embodiment, a substantially vertical portion 762 of each post 761 can be completely surrounded by the second conductive element 770. Each post 761 can extend within a corresponding one of a plurality of openings 771 extending vertically within the second conductive element 770. Similar to the posts 761, the openings 771 can be arranged in an m×n array, each of m and n being greater than 1. In a particular embodiment, as shown in FIG. 7C, the openings 771 can be arranged in more than one array, including an m×n array in a region C of the component 710 and an m'×n' array in a region D of the component, where m can be the same or different than m' and n can be the same or different than n'.

At the second surface 722 of the substrate 720, the second conductive element 770 can be connected to a single second electrode 773 exposed at the second surface, the second electrode being connectable with a second electric potential. The second electrode 773 can optionally be a plurality of electrodes exposed at the second surface, such that a portion of the second electrode extending between the plurality of electrodes can be covered by an overlying insulating dielectric layer except where exposed for interconnection with another element external to the capacitor 740. In a particular embodiment, one ore more of the first and second electrodes 763 and 773 can be electrically connected to the respective first and second conductive elements 760 and 770 by conductive traces extending therebetween.

The capacitor dielectric layer 780 can separate and insulate the first and second electrically conductive elements 760 and 770 from one another at least within the through opening 730. In one example, the capacitor dielectric layer 780 can extend along the surfaces of the plurality of posts 761. The capacitor dielectric layer 780 can be considered to have an undulating shape, at least within the opening 730. In a particular embodiment, an undulating first surface 736 and an undulating second surface 738 of the capacitor dielectric layer 780 can each have a length along the respective surfaces at least triple the height H2 of the opening 730 between the first and second surfaces 721 and 722.

Although the first electrically conductive element 760 has been shown and described above as having solid metal posts 761 and the second electrically conductive element 770 has been shown and described above as having a solid metal mesh-shape, in a particular embodiment, one or both of the first and second conductive elements 760 and 770 can be a conformal metal layer, such as the first and second conductive elements 561" and 570" described above with reference to FIG. 5F. In one example, one or both of the first and second conductive elements 760 and 770 can be very thin conformal metal layers that can be deposited onto the capacitor dielectric layer 780 to form using, for example, atomic layer deposition (ALD).

Figure 8D:
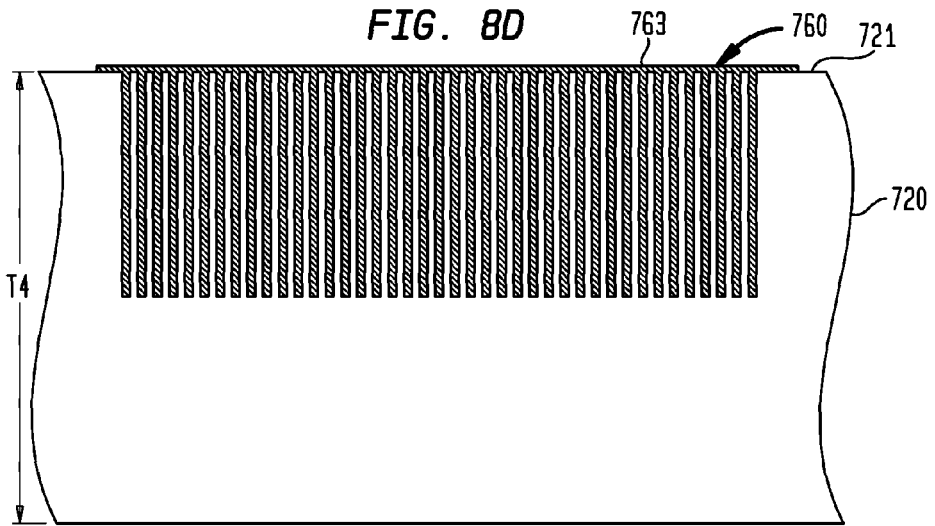

A method of fabricating the component 710 (FIG. 7) will now be described, with reference to FIGS. 8A-8F. As illustrated in FIG. 8A, material can be removed from the first surface 721 of the substrate 720 to form a plurality of first openings 734 extending from the first surface towards the second surface 722. In a particular example, the first openings 734 can be arranged in m×n array, each of m and n being greater than 1, each first opening extending in the vertical direction V1, the plurality of first openings defining an inner surface 735. In a particular embodiment, the inner surface 735 can be considered to have an undulating shape. In one embodiment, the first openings 734 can be formed using similar methods as those described above with respect to FIG. 2A.

In one example, each of the first openings 734 can have a width W' in the horizontal direction H1 of 5 microns or less. Each first opening 734 can have a length L' in the vertical direction. In one embodiment, the ratio of the length L' to the width W of each first opening 734 can be at least 10. In a particular example, the length L' of each first opening 734 can be at least 150 microns. In another example, the first openings 734 can define a pitch in the horizontal direction H1 of 10 microns or less.

In a particular embodiment, the first openings 734 can be a plurality of pores that are formed by anisotropic etching, such that a region R of porous silicon is produced extending from the first surface 721 of the substrate 720. In such an anisotropic etching process, the region R of porous silicon can be formed by electrochemical dissolution of the silicon substrate 720 in a solution based on hydrofluoric acid. The first surface 721 of the silicon substrate 720 to be made porous can be placed in contact with the hydrofluoric acid that is in contact with a first electrode while the second surface 722 can be contacted to a second electrode to form an anodization circuit.

At a high anodic current, the first surface 721 of the silicon substrate 720 can undergo electro-polishing. When the current is low, the morphology of the surface 721 can become dominated by a dense array of first openings or pores 730 penetrating deeply into the bulk of the silicon substrate. Initially, the pores 734 can start forming in a randomly distributed array. Alternatively, the location and size of the pores 734 in an array can be determined by locations of openings in a photoresist mask or a hard mask overlying the first surface 721, for example, which is patterned prior to performing the porous silicon etch process. When the adjacent pores 734 grow, their depletion zones overlap and this can stop the sideways etching in the horizontal direction H1. The etching can only proceed in the vertical direction V1, hence shifting from isotropic to anisotropic. This process can be self-regulating because eventually, the pores 734 cannot further increase in diameter due to depletion zones acting as etch stops along the inner surface 735 of the pores. This forces the etching to occur only at the bottom of the pores.

After such an anisotropic etching process, the first openings 734 can be arranged in m×n array, each of m and n being greater than 1. In a particular embodiment, the openings 734 can be arranged in more than one array, similarly to the arrangement of the posts 761 and the openings 771 shown in FIG. 7C, including an m×n array in a first region of the component 710 and an m'×n' array in a second region of the component, where m can be the same or different than m' and n can be the same or different than n'.

Thereafter, as illustrated in FIG. 8B, a capacitor dielectric layer 780 can be formed overlying the inner surface 735 of the first openings 734 and portions of the first surface 721. In a particular embodiment (not shown), an insulating dielectric layer can be formed overlying portions of the first surface 721 and extending within a subset of the first openings 734 that will later form portions of a boundary surface 731 of the through opening 730 (FIG. 7A). In one example, such an insulating dielectric layer can extend within the through opening between the first and second surfaces 721 and 722. In an exemplary embodiment, such an insulating dielectric material can separate and insulate the first and second conductive elements 760 and 770 from the material of the substrate 720 at least within the through opening 730. In one embodiment, such an insulating dielectric material can be separated from the boundary surface 731 of the through opening 730 by at least one of the posts 761.

In a particular embodiment, a first surface 736 and a second surface 738 of the capacitor dielectric layer 780 can be considered to have an undulating shape. In one example, the first and second surfaces 736, 738 of the capacitor dielectric layer 780 can each have a length at least triple the length L' of each first opening 734. The dielectric layer 780 (and an optional insulating dielectric layer) can be formed using similar methods as those described above with respect to FIG. 2B.

Thereafter, as illustrated in FIG. 8C, the plurality of conductive posts 761 of the first electrically conductive element 760 can be formed overlying the first surface 736 of the dielectric layer 780 and extending into each of the first openings 734, the first surface of the dielectric layer facing away from the inner surface 735 of the first openings. The first conductive element 760 can be formed using similar methods as those described above with respect to FIG. 2C.

Thereafter, as illustrated in FIG. 8D, the first electrode 763 can be formed connected to the first electrically conductive element 760. The first electrode 763 can be formed such that it is exposed at the first surface 721 of the silicon substrate 720. The first electrode 763 can be connectable to a first electric potential. In a particular embodiment, the first conductive element 760 can include the first electrode 763.

Figure 8E:
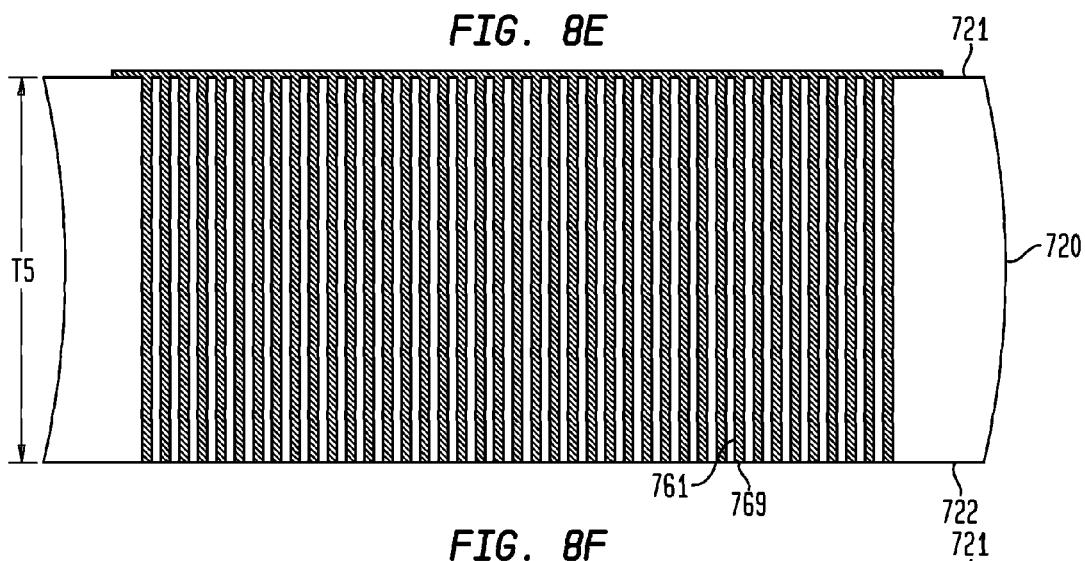

Thereafter, as illustrated in FIG. 8E, the thickness of the substrate 720 between the first and second surfaces 721 and 722 can be reduced, thereby exposing distal edges 769 of the plurality of conductive posts 761 at the second surface 722. Grinding, lapping, or polishing of the second surface 722 or a combination thereof can be used to reduce the thickness of the substrate 720. During this step, as an example, the initial thickness T4 (shown in FIG. 8D) of the substrate 720 can be reduced from about 700 μm to a thickness T5 (shown in FIG. 8E) of about 130 μm or less. In a particular embodiment, the process of reducing the thickness of the substrate 720 can be stopped earlier, such that the portions of the dielectric layer 780 that cover the distal edges 769 of the posts 761 will not be removed.

Figure 8F:
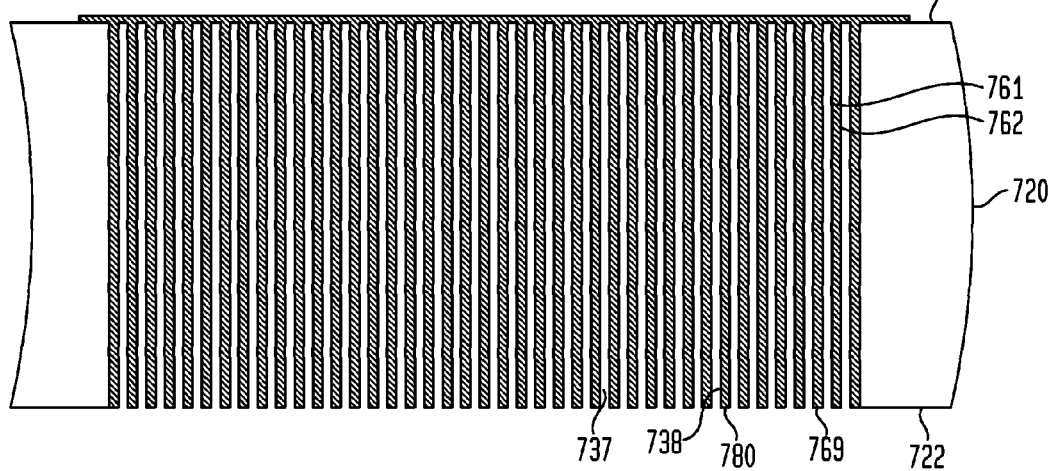

Thereafter, as illustrated in FIG. 8F, material can be removed from the second surface 722 of the substrate 720 between adjacent ones of the posts 761 to expose the second surface 738 of the capacitor dielectric layer 780, thereby forming the second opening 737 extending from the second surface towards the first surface 721. The second opening 737 can be formed using similar methods as those described above with respect to FIG. 2A. The second opening 737 can have a mesh shape, such that the second opening can extend between adjacent ones of the posts 761. In a particular embodiment, a substantially vertical portion 762 of each post 761 can be completely surrounded by the second opening 737.

In a particular embodiment (not shown), before removing material from the second surface 722 to form the second opening 737, portions of an insulating dielectric layer can be formed overlying the second surface, except at portions of the second surface where it is desired to form the second opening 737. Such portions of an insulating dielectric layer can be formed using similar methods as those described above with respect to FIG. 2B.

Thereafter, if portions of the capacitor dielectric layer 780 were removed from overlying the distal edges 769 of the posts 761 when the thickness of the substrate 720 was reduced as described above with reference to FIG. 8E, additional portions of the capacitor dielectric layer 780 can be formed overlying the distal edges 769 of the posts 761. The additional portions of the dielectric layer 780 can be formed using similar methods as those described above with respect to FIG. 2B.

In a particular embodiment (not shown), before forming the second conductive element 770 (FIG. 7A), an insulating dielectric layer can be formed overlying portions of the second surface 722 and extending within a portion of the second opening 737 that forms portions of a boundary surface 731 of the through opening 730 (FIG. 7A). In one example, such an insulating dielectric layer can extend within the through opening between the first and second surfaces 721 and 722. In an exemplary embodiment, such an insulating dielectric material can separate and insulate the first and second conductive elements 760 and 770 from the material of the substrate 720 at least within the through opening 730. In one embodiment, such an insulating dielectric material can be separated from the boundary surface 731 of the through opening 730 by at least one of the posts 761.

Thereafter, referring again to FIG. 7A, the second electrically conductive element 770 can be formed overlying the second surface 738 of the capacitor dielectric layer 780 and extending into the second opening 737. The second electrically conductive element 770 have a mesh shape as described above and can include the openings 771 (FIG. 7C). The second electrode 773 can be formed in contact with the second conductive element 770. The second electrode 773 can be exposed at the second surface 722, and the second electrode can be connectable to a second electric potential. In a particular embodiment, the second conductive element 770 can include the second electrode 773. The second conductive element 770 can be formed using similar methods as those described above with respect to FIG. 2C.

Figure 9:
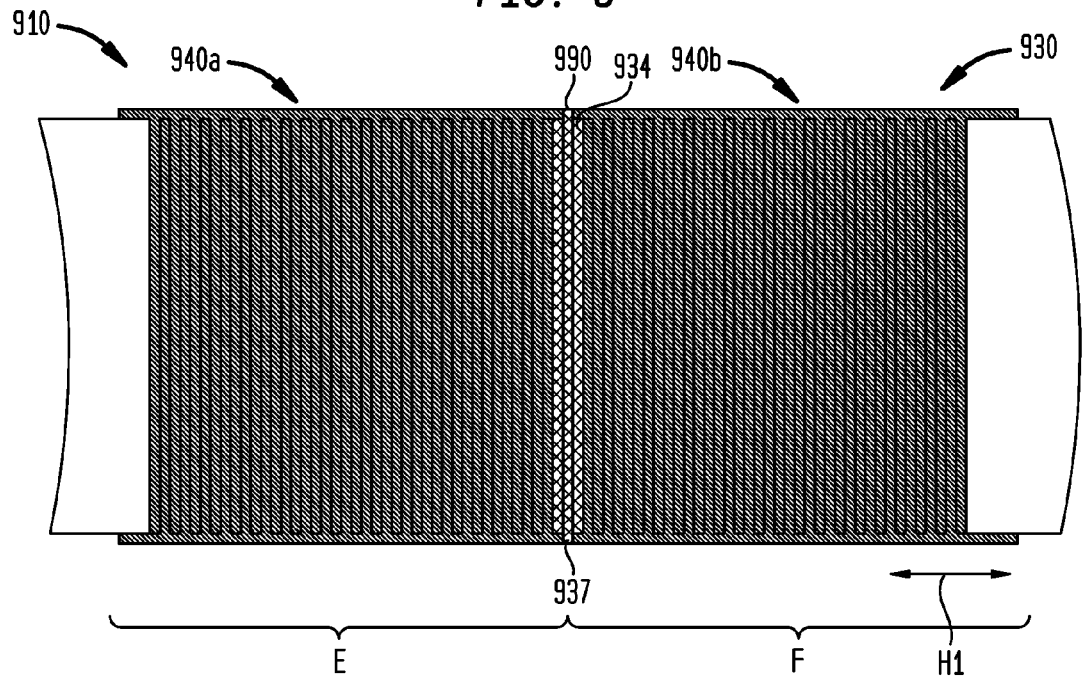
FIG. 9 is a sectional view illustrating a capacitor in accordance with another embodiment.

FIG. 9 illustrates a variation of the component of FIGS. 7A-7C. The component 910 is similar to the component 710 described above, except that the component 910 includes first and second independent capacitors 940a, 940b extending through a single through opening 930, each capacitor 940a, 940b comprising a respective region E or F of the component with an insulating dielectric material 990 extending within a plurality of the first openings 934 and/or a portion of the second opening 937 located between the first and second capacitors.

In a particular example (not shown), the dielectric material 990 can extend partially within each of the plurality of the first openings 934 and/or partially within the portion of the second opening 937 located between the first and second capacitors, such that the dielectric material can trap air within the first openings and the portion of the second opening, thereby permitting the combination of the air and the dielectric material 990 to at least partially separate and electrically insulate or isolate the first and second capacitors 940a, 940b from one another.

In such an embodiment having first and second independent capacitors 940a, 940b extending through a single through opening 930, the conductive posts 961 of each capacitor can occupy first and second subsets of the first openings 930, and the dielectric material 990 can occupy a third subset of the first openings located between the first and second subsets of first openings in the horizontal direction H1.

In the capacitor embodiments described above, the first and second electrically conductive elements are shown and described as separated and insulated from the material of the substrate by an insulating dielectric material. However, in some embodiments where the substrate has a relatively high dielectric constant, such as when the substrate is glass or ceramic, one or both of the first and second electrically conductive elements can directly contact the material of the substrate without having an insulating dielectric material located between the conductive elements and the substrate.

Figure 10:
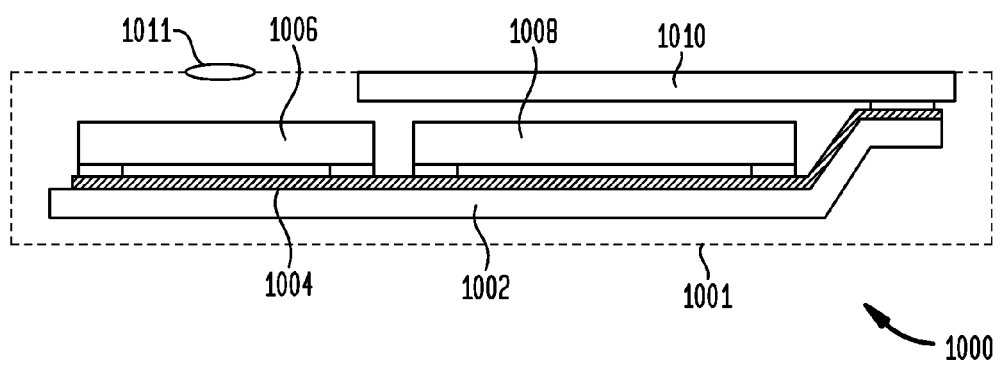
FIG. 10 is a schematic depiction of a system according to one embodiment of the invention.

The microelectronic assemblies described above can be utilized in construction of diverse electronic systems, as shown in FIG. 10. For example, a system 1000 in accordance with a further embodiment of the invention includes a microelectronic assembly 1006 as described above in conjunction with other electronic components 1008 and 1010. In the example depicted, component 1008 is a semiconductor chip whereas component 1010 is a display screen, but any other components can be used. Of course, although only two additional components are depicted in FIG. 10 for clarity of illustration, the system may include any number of such components. The microelectronic assembly 1006 may be any of the assemblies described above. In a further variant, any number of such microelectronic assemblies may be used.

The microelectronic assembly 1006 and components 1008 and 1010 can be mounted in a common housing 1001, schematically depicted in broken lines, and are electrically interconnected with one another as necessary to form the desired circuit. In the exemplary system shown, the system includes a circuit panel 1002 such as a flexible printed circuit board, and the circuit panel includes numerous conductors 1004, of which only one is depicted in FIG. 10, interconnecting the components with one another. However, this is merely exemplary; any suitable structure for making electrical connections can be used.

The housing 1001 is depicted as a portable housing of the type usable, for example, in a cellular telephone or personal digital assistant, and screen 1010 is exposed at the surface of the housing. Where structure 1006 includes a light-sensitive element such as an imaging chip, a lens 1011 or other optical device also may be provided for routing light to the structure. Again, the simplified system shown in FIG. 10 is merely exemplary; other systems, including systems commonly regarded as fixed structures, such as desktop computers, routers and the like can be made using the structures discussed above.

The openings and conductive elements disclosed herein can be formed by processes such as those disclosed in greater detail in the co-pending, commonly assigned U.S. patent application Ser. Nos. 12/842,587, 12/842,612, 12/842,651, 12/842,669, 12/842,692, and 12/842,717, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of fabricating a component having electrodes for electrical interconnection with a circuit component or microelectronic element, comprising:

removing material from a first surface of a substrate consisting essentially of a material having an effective CTE of less than 10 ppm/° C. to form a plurality of first openings extending from the first surface towards a second surface opposite the first surface, the first openings defining an undulating inner surface;

forming a capacitor dielectric layer overlying the inner surface, the capacitor dielectric layer having an undulating first surface facing away from the inner surface;

forming a first metal element overlying the first surface of the capacitor dielectric layer and extending into each of the first openings;

removing material of the substrate between adjacent ones of the plurality of first openings so as to expose an undulating second surface of the capacitor dielectric layer to form a plurality of second openings extending from the second surface towards the first surface; and forming a second metal element overlying the second surface of the capacitor dielectric layer and extending into each of the second openings.

2. The method as claimed in claim 1, wherein the step of removing material of the substrate between adjacent ones of the plurality of first openings is performed such that a surface of the first metal element is exposed at the second surface.

3. The method as claimed in claim 1, wherein the step of forming the first metal element includes forming a plurality of first plates, each of the first plates extending into a respective one of the first openings, and the step of forming the second metal element includes forming a plurality of second plates, each of the second plates extending into a respective one of the second openings.

4. A method of fabricating a component having electrodes for electrical interconnection with a circuit component or microelectronic element, comprising:

forming a plurality of first openings extending from a first surface of a substrate towards a second surface opposite the first surface, the first openings arranged to occupy at least some positions in an m×n array of positions, each of m and n being greater than 1, each first opening extending into the through opening in a vertical direction substantially perpendicular to the first surface, the plurality of first openings defining an inner surface;

forming a first capacitor dielectric layer overlying a first portion of the inner surface, the first capacitor dielectric layer having a first surface facing away from the inner surface;

forming a first metal element having a plurality of posts, each post overlying the first surface of the first capacitor dielectric layer and extending into a corresponding opening of the first openings;

removing material of the substrate between adjacent ones of the first subset of the plurality of posts so as to expose a second surface of the first capacitor dielectric layer to form a second opening extending from the second surface towards the first surface; and forming a second metal element overlying the second surface of the first capacitor dielectric layer and extending into the second opening.

5. The method as claimed in claim 4, wherein a first plurality of the posts extend into a first subset of the first openings located at a first plurality of positions within the m×n array, further comprising depositing an insulating dielectric material into a second subset of the first openings located at a second plurality of positions within the m×n array.

6. The method as claimed in claim 4, wherein the plurality of posts extends into all of the first openings.

7. The method as claimed in claim 4, wherein the first openings are formed by removing material from the first surface to form a plurality of pores.

8. The method as claimed in claim 4, wherein the substrate comprises a silicon material, and wherein the step of forming the plurality of first openings is performed by anisotropic etching, such that a region of porous silicon is produced extending from the first surface of the substrate.

9. The method as claimed in claim 4, wherein the step of forming the plurality of first openings is performed such that the inner surface has an undulating shape.

10. The method as claimed in claim 9, wherein the step of forming the plurality of first openings is performed such that each first opening has a length in the vertical direction, the ratio of the length to the width of each first opening being at least 10.

11. The method as claimed in claim 4, wherein the step of forming the first capacitor dielectric layer is performed such that the first surface of the first capacitor dielectric layer has an undulating shape.

12. The method as claimed in claim 11, wherein the second surface of the first capacitor dielectric layer has an undulating shape.

13. The method as claimed in claim 4, wherein the step of forming the first capacitor dielectric layer is performed such that upper and lower surfaces of the capacitor dielectric layer each have a length at least triple the length of each first opening.

14. The method as claimed in claim 13, wherein the step of removing material of the substrate between adjacent ones of the first subset of the first openings is performed such that a surface of each of the posts is exposed at the second surface.

15. The method as claimed in claim 4, wherein the step of forming the first metal element is performed such that each post includes a substantially vertical portion that is substantially parallel to a corresponding substantially vertical portion of at least one adjacent post.

16. The method as claimed in claim 4, further comprising:

forming a second capacitor dielectric layer overlying a second portion of the inner surface, the second capacitor dielectric layer having a first surface facing away from the inner surface;

forming an insulating dielectric layer overlying a third portion of the inner surface between the first and second portions of the inner surface, the insulating dielectric layer extending into a second subset of the first openings;

forming a third metal element having a plurality of posts, each post overlying the first surface of the second capacitor dielectric layer and extending into a corresponding opening of a third subset of the first openings;

removing material of the substrate between adjacent ones of the third subset of the first openings so as to expose a second surface of the second capacitor dielectric layer to form a third opening extending from the second surface towards the first surface; and forming a fourth metal element overlying the second surface of the second capacitor dielectric layer and extending into the third opening.

17. The method as claimed in claim 16, wherein the insulating dielectric layer has a dielectric constant of less than 3, and each capacitor dielectric layer has a dielectric constant greater than or equal to 3.

18. The method as claimed in claim 16, further comprising forming first, second, third, and fourth electrodes respectively connected to the first, second, third, and fourth metal elements, the first and third electrodes being exposed at the first surface, the second and fourth electrodes being exposed at the second surface, the first, second, third, and fourth electrodes being connectable to respective first, second, third, and fourth electric potentials.

19. The method as claimed in claim 16, wherein the first and second metal elements and the first capacitor dielectric layer define a first capacitor, and the third and fourth metal elements and the second capacitor dielectric layer define a second capacitor.

20. The method as claimed in claim 19, wherein the insulating dielectric layer separates and insulates at least a portion of the first and second capacitors from one another.

* * * * *